United States Patent
Collins et al.

(10) Patent No.: US 10,833,301 B2
(45) Date of Patent: Nov. 10, 2020

(54) THROUGH SILICON VIA ENERGY STORAGE DEVICES

(71) Applicant: International Business Machines Corporation, Armonk, NY (US)

(72) Inventors: John Collins, Tarrytown, NY (US); Mahadevaiyer Krishnan, Hopewell Junction, NY (US); John Papalia, New York, NY (US); Robert Bruce, White Plains, NY (US); Adele L. Pacquette, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/238,389

(22) Filed: Jan. 2, 2019

(65) Prior Publication Data
US 2020/0212383 A1  Jul. 2, 2020

(51) Int. Cl.
| | |
|---|---|
| *H01M 2/10* | (2006.01) |
| *H01L 21/768* | (2006.01) |
| *H01L 23/48* | (2006.01) |
| *H01M 10/0585* | (2010.01) |

(52) U.S. Cl.
CPC .... *H01M 2/1055* (2013.01); *H01L 21/76871* (2013.01); *H01L 21/76898* (2013.01);
(Continued)

(58) Field of Classification Search
CPC ............. H01L 23/481; H01L 23/49593; H01L 23/49827; H01L 23/49589; H01L 23/5223;
(Continued)

(56) References Cited

U.S. PATENT DOCUMENTS

| | | |
|---|---|---|
| 6,432,577 B1 | 8/2002 | Shul et al. |
| 9,123,954 B2 | 9/2015 | Nathan |
| (Continued) | | |

FOREIGN PATENT DOCUMENTS

| | | |
|---|---|---|
| WO | 2017010887 | 1/2017 |

OTHER PUBLICATIONS

K. Hoeppner, et al., "Design, Fabrication, and Testing of Silicon-integrated Li-ion" IOP Publishing 2015.
(Continued)

*Primary Examiner* — David C Spalla
(74) *Attorney, Agent, or Firm* — Fleit Intellectual Property Law; Thomas S. Grzesik

(57) ABSTRACT

A method for forming a semiconductor includes forming at least one trench in a silicon substrate. The at least one trench provides an energy storage device containment feature. An electrical and ionic insulating layer(s) is formed on a top surface of the substrate and sidewalls of the trench. A plurality of vias is formed through a base of the trench. The plurality of vias is filled with a metal material. A trench base current collector at the base of the trench and backside current collector at the backside of the substrate are formed from the metal material. These current collectors enable electric and thermal conductive planarization and device isolation through the substrate. A plurality of energy storage device layers is formed over the trench base current collector, and a topside current collector is formed over the plurality of energy storage device layers. A protective encapsulation layer may then be formed.

19 Claims, 21 Drawing Sheets

(52) U.S. Cl.
CPC ...... *H01L 23/481* (2013.01); *H01M 10/0585* (2013.01); *H01M 2220/30* (2013.01)

(58) Field of Classification Search
CPC ... H01L 23/5226; H01L 23/528; H01L 23/58; H01L 23/585; H01L 27/0733; H01L 27/0805; H01M 2/1022; H01M 2/1044; H01M 2/1055; H01M 2220/30

See application file for complete search history.

(56) References Cited

U.S. PATENT DOCUMENTS

| | | | |
|---|---|---|---|
| 9,847,373 | B2 | 12/2017 | Fornara et al. |
| 9,859,542 | B2 | 1/2018 | Weis et al. |
| 9,917,333 | B2 | 3/2018 | Rajaraman et al. |
| 2012/0121983 | A1 | 5/2012 | Yoon et al. |
| 2013/0078513 | A1 | 3/2013 | Nathan |
| 2016/0006016 | A1 | 1/2016 | Porthault et al. |
| 2017/0040580 | A1* | 2/2017 | Andry ............ H01M 2/08 |
| 2017/0301616 | A1 | 10/2017 | Biederman et al. |
| 2017/0346097 | A1* | 11/2017 | Andry ............ H01M 6/40 |

OTHER PUBLICATIONS

R. Hahn, et al. "Development of rechargeable micro batteries based on micro channel structures", pp. 619-623 2012.

R. Hahn, et al. "Silicon Integrated Micro Batteries based on Deep Reactive Ion Etching", pp. 1571-1577 2012.

Takahide Murayama et al., "Micro Thin-film Li-ion Battery Stacking Challenge", pp. 183-186 2017.

* cited by examiner

THROUGH SILICON VIA ENERGY STORAGE DEVICES

BACKGROUND OF THE INVENTION

The present disclosure generally relates to the field of semiconductor devices, and more particularly relates to energy storage devices.

Exponential growth in portable electronic devices has created significant interest in compact batteries or energy storage devices offering high-power density and capacity. Lithium-ion batteries provide higher energy density compared with other rechargeable battery systems such as lead-acid, nickel-cadmium and nickel-metal hydride batteries.

SUMMARY OF THE INVENTION

In one embodiment, a method for forming a semiconductor device structure is disclosed. The method comprises forming at least one trench in a silicon substrate. The at least one trench provides an energy storage device containment feature. An electrical and ionic insulating layer(s) is formed on a top surface of the silicon substrate and sidewalls of the at least one trench. A plurality of vias is formed through a base of the at least one trench. The plurality of vias is filled with a metal material. A trench base (first) current collector at the base of the trench and backside (second) current collector at the backside of the substrate are formed from the metal material. These current collectors enable electric and thermal conductive planarization and device isolation through the silicon substrate. A plurality of energy storage device layers is formed over the trench base current collector, and a topside (third) current collector is formed over the plurality of energy storage device layers. A protective encapsulation layer may then be formed.

In another embodiment, a method for forming a semiconductor device structure is disclosed. The method comprises forming a plurality of vias through a backside of a silicon substrate. The vias are then filled with a metal material. At least one trench is formed through a topside of the silicon substrate providing an energy storage device containment feature. The at least one trench exposes the metal material filled vias. An electrical and ionic insulating layer(s) is formed on a top surface of the silicon substrate and sidewalls of the at least one trench. A trench base (first) current collector at the base of the trench and backside (second) current collector at the backside of the substrate are formed from the metal material. These current collectors enable electric and thermal conductive planarization and device isolation through the silicon substrate. A plurality of energy storage device layers is formed over the trench base current collector, and a topside (third) current collector is formed over the plurality of energy storage device layers. A protective encapsulation layer may then be formed.

In a further embodiment, semiconductor device structure is disclosed. The semiconductor device structure at least comprises the following features. A silicon substrate having at least one trench disposed therein. The at least one trench providing an energy storage device containment feature with ionic and electronic isolation of the energy storage device. A plurality of vias is formed within a base of the trench. Each via of the plurality of vias comprises metal material. A trench base current collector is disposed within the at least one trench and on the plurality of vias in contact with the metal material. A backside current collector is disposed on a backside of the silicon substrate opposite the at least one trench and in contact with the metal material.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
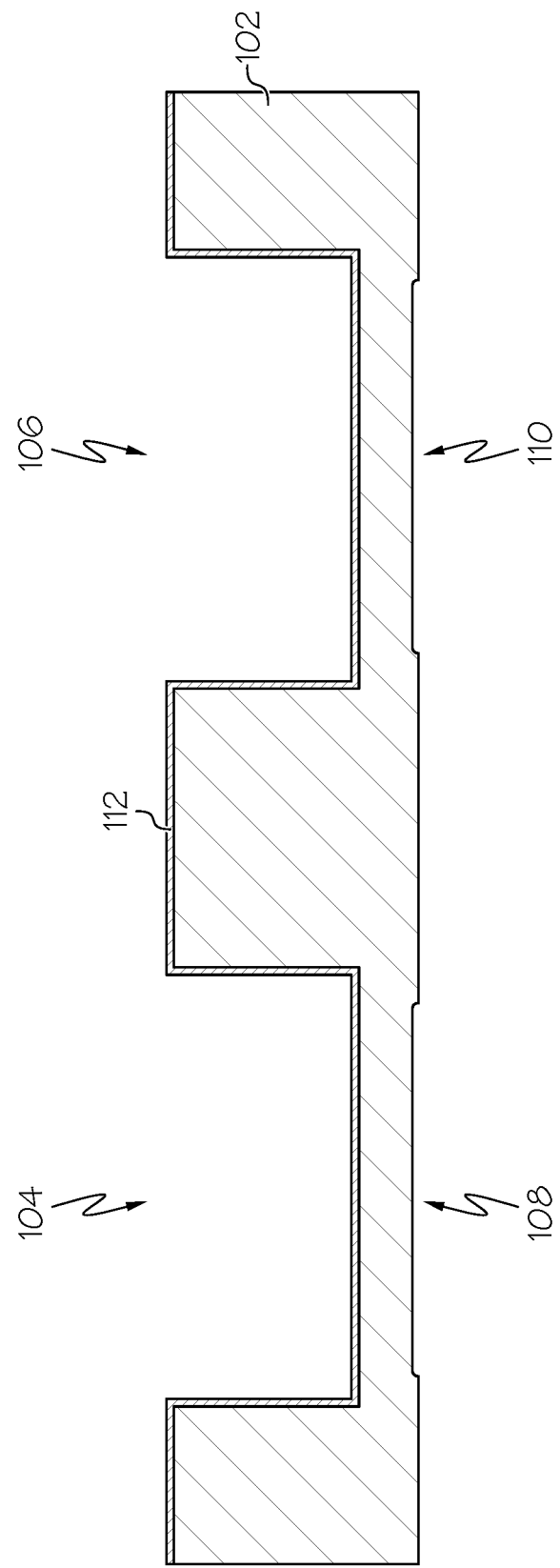
FIG. 1 is a cross-sectional view of a semiconductor structure after plurality of trenches have been formed in a substrate and an electronic and ionic insulating layer(s) has been formed thereon according one embodiment of the present invention.

Illustrative embodiments of the invention may be described herein in the context of illustrative methods for forming energy storage devices, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be further understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The integration of batteries, or more generally energy storage devices, in microprocessor and memory chips is a significant requirement for Internet of Things (IoT) devices and other emerging applications. IoT and other types of devices may require high capacity and power density from miniaturized energy storage devices embedded in complementary metal-oxide-semiconductor (CMOS) circuits or as stand-alone microbatteries encapsulated in 3D patterned silicon material which can then be integrated with any electronic or microelectronic device. It is anticipated that, over the next generation, required energy consumption for electronic devices will decrease as various human controlled and autonomous devices will become increasingly miniaturized and their power consumption, harvesting, integration and source processes become further optimized. For example, power consumption for some IoT devices is expected to be lower than one Watt. Emerging applications requiring such on-board next generation energy storage devices include IoT devices, mobile devices, sensory equipment, and various autonomous environment, biological, neuromorphic and social functioning machines. Smart dust and biomedical sensory and drug delivery devices are examples of such functional devices.

Existing energy storage devices that are primarily associated with such applications often take the form of thin or thick film battery devices and have drawbacks in several key areas. For example, such conventional energy storage devices usually do not possess or provide high-power density function or long energy delivery (high capacity) capabilities. Further, conventional energy storage devices are generally not able to be integrated into single, small volume, low weight dimensions. Conventional energy storage devices also typically utilize liquid electrolytes, which have inherent safety hazards, particularly the organic components of liquid electrolytes and their exposure to air when the battery is in a high state of charge (SOC). Conventional energy storage devices usually lack durability and sustainable encapsulation and packaging (e.g., conventional housing units lack sufficient puncture resistance, degrade upon use, thus opening the cell to the outside environment and creating a fire hazard, and/or have an active energy storage device surface area to packaging surface area ratio equal to or less than 0.59). Further, processing method limitations constrain the ability to fabricate energy storage device active layers (either independently or when integrated into an energy storage housing unit or device) in an in-situ fashion.

New energy storage devices and energy storage housing units for the containment of active energy storage components or layers are needed to facilitate both high power density or high capacity capability over many reversible cycles. These energy storage devices should have non-hazardous, high voltage-loading solid electrolytes and electrodes, typically integrated with all-solid-state composition layers or composite electrode materials. The general makeup of such energy storage and delivery miniaturized devices should take the form of standard battery or capacitor as well as advanced/hybrid battery-type supercapacitor energy storage device components or layers contained within an environmentally energy storage housing unit.

Regarding the makeup of standardized energy storage devices, metal current collectors typically comprise the first and last layers of energy storage devices. The anode or cathode material follows the current collector as the layer intimately (chemically and physically) associated with the first current collector. The layer intimately associated with the other side of the anode/cathode and its opposing anode or cathode component is the electrolyte layer. The opposing current collector is intimately associated with the second anode/cathode layer.

It should be noted that the respective anode, cathode and electrolyte layers do not need be isolated layers in terms of composition and that often composite electrodes (e.g., containing varying concentrations of electrode (anode or cathode) material and electrolyte material and optionally performance enhancing additive material(s) all which can or cannot vary in their homogeneity with respect to component thickness or cross-section view) which enable advanced energy storage device performance as well as decreased impedance of a working energy storage device. In this manner, an ionically conductive pathway for ions composed by materials such as lithium, sodium, sulfur, potassium, zinc, etc., which enables the directionalized (primary) and reversible multi-directionalized (secondary) charge and discharge functions between opposing anode and cathode layers.

The outside ends of the opposing current collectors are attached to the devices load where energy (electrons) is transferred/delivered between the device being powered and the energy storage device. The far majority of electrons do not travel between the opposing anode and cathode layers via the electrolyte layer(s). Ideally, this is where only ions flow allowing for electrical insulation between cathode and anode. In this way, a voltage difference and separation between the opposing cathode (e.g., $LiCoO_2$ (LCO), $LiMnO_4$ (LMO), $LiFePO_4F$ (LFPF), $LiCo_{0.3}Ni_{0.3}Mn_{0.3}O_2$ (NMA), Nickel Manganese Cobalt Oxide (NMC) or any other voltage-potential-stable lithium/metal oxide intercalation or conversion type material and anode (negative electrode) materials are composed of materials such as graphite (G), lithiated graphite $LiC_6$ (Li-G), Li-metal, $Li_4Ti_5O_{12}$ (Li-titanate), $Li_{4.4}Si$ (Li-silicon), crystalline silicon, silicon/carbon/metal composite or any other low voltage stable lithium host material(s). Such an inherent voltage difference between opposing electrodes may be necessary for the manipulative transport of ion-charge between the two opposing electrodes of the energy storage device.

Energy storage device housing units should provide both environmental and electrical insulation from the outside environment while always facilitating or supporting the integration of energy storage devices or energy storage device layers or components. Such properties allow for the energy storage device to perform as intended with ease, cost, and time of fabrication or manufacture maintained to a minimum. In such electronic devices, the energy storage housing unit may be made up of an encasement area and volume that houses a typical arrangement of active battery components and conforms to typical battery device architecture with intended energy storage, delivery and electronic-device-packaged functions.

One of the most progressive forms of such energy storage housing components are usually created by implementing three-dimensional (3D) space/volume cavities, micro-cavities, channels, or trenches typically through etching, pressure, or otherwise destructive methods implemented onto/into two-dimensional (2D) substrates such as silicon. The beneficial aspects of implementing energy storage housing devices into such semiconductor-type materials as silicon are paramount for the integration of power devices into commercially-ubiquitous starting substrates of technologically smarter, more autonomous and capable functioning devices. The need for the standardization of energy storage housing devices that can be commercially utilized for the storage of both thin film (relatively lower capacity/higher power density capability) and thicker films, layers, or components (relatively higher capacity/lower power density capability) is critical in the commercial development of micro-power and micro-battery capabilities.

Three-dimensional (3D) substrates are commonly seen as a worthy pathway in enabling this capability, where increased surface area in smaller volumes may allow for higher power density, dependent on the electrolyte material/resistive properties of the material used and proximity between opposing electrodes, as well as higher theoretical capacities due to increased electrochemically accessible surface area of electrode materials. Thinner battery layer components may concurrently yield increased power density capability, whereas thicker layer components may lead to increases in cell capacity. However, increasing the active surface area through 3D architectures creates inherent working limitations. Due to the changing angle of deposition between vertical, horizontal, and acute-angled substrate walls inconsistencies occur in single-component layer thickness and conformality. Such non-uniformity of layering results in thicker and thinner areas within a given battery layer, thus polarizing the transfer of charge towards preferentially the thinnest layer areas and creating charge transfer "hot spots". This leads to dielectric breakdown when the electrolyte thinness goes below minimum thickness thresholds, and results as limiting the charge-transfer capabilities of the entire cell as well as enabling a short-circuiting hazard if the two opposing electrodes were to electrically connect. This effect is especially observed at higher applied currents, rendering the cell incapable of higher power densities beyond the minimum Coulombic capabilities (e.g., <1 C).

Two-dimensional (2D) substrates do not typically illustrate the above described working limitations of 3D substrates. Since layer uniformity, stacking and adhesion is often easily achieved in a 2D plane, homogeneous and highly effective ion/charge-transfer has been demonstrated for battery materials with high cycle life and coulombic efficiency. However, the major limitation of 2D battery materials is simply that their cell capacity is limited by the size of the 2D plane making up the battery stack. This is an unacceptable limitation in advancing the energy storage capability of smaller and smaller micro-batteries where greater and greater capacities as well as power densities are increasingly in demand.

One primary challenge associated with the development of miniaturized energy storage devices is achieving higher capacity and higher power density in smaller and smaller volumes and foot prints. Achieving the higher performance is made difficult by the intimate contact of active battery layers and controlling the composition and integrity of the chemical layers, especially between electrolyte/electrode interfacial areas, that result from changing voltages of the cell. Hence, secondary (initiated-through-active-use) chemical reactions of the energy storage devices control the performance of the working cell. It is therefore critical for the evolving battery technology to control and purposefully develop routes to desired, pre-determined interface chemistries.

For higher energy and power densities to be achieved in relatively small volumes, it is critical for two-dimensional (2D) battery layer conformality with resulting high ion/charge-transfer efficiencies to be implemented in a 3D high surface area substrate while also having voltage-favorable secondary reaction developed throughout the interface chemistry areas of the cell, or comprises an energy storage device layer composition where the chemistry which developed at interfacial regions is eliminated or greatly minimized to maintain high performance with low levels of interfacial impedance. Layer thickness, interface cross-bonding and interfacial physical/chemical overlap of opposing layer components should also be precisely controlled in tuning the fabricated battery's power and internal resistance properties, which inherently determine the battery's performance capability.

Advantageously, embodiments provide a novel micro-energy storage device and fabrication method so that the above combination may be carried out effectively. As will be discussed in greater detail below, 2D layered materials may be independently deposited in a scalable fashion. This enables tunability of energy capacity based on independent layer thickness. Furthermore, some embodiments provide a method by which microbatteries of all common and non-common deposition and composition types (wet and/or dry; hybrid materials or deposition methods) may be utilized in a single scalable silicon substrate that is electrically and ionically insulated or patterned. The single scalable silicon substrate comprises a hermetically sealed metal contact, prior to battery component deposition, and subsequently comprises an opposing hermetically sealed metal contact once all battery component layers have been deposited.

Energy storage device housing units in some embodiments enable a standardized energy storage device housing unit that is environmentally and electrically insulated, and which can be utilized for the deposition of wet, dry or a hybrid of wet and/or dry energy storage device active layers. Advantageously, this solves the issue surrounding the commercial fabrication of a standardized through silicon via (TSV) type energy storage housing that may be utilized for completely solid-state energy storage devices, liquid state energy storage devices, semi-solid energy storage devices, or any combination of variable state of materials that can be utilized together to produce a working energy storage device.

In addition, the energy storage device housing units in some embodiments are scalable for the housing and containment of desired working conditions for both thin and thick active energy storage device components and layers. The working conditions may be determined by the dimensionality of the starting energy storage device housing substrate and the dimensionality of user-created trenches, channels, pores, or free-space created areas. These aspects of one or more embodiments solve the problem of enabling control of the dimensionality and thickness. These aspects further solve the problem of enabling performance characteristics of the completed TSV type energy storage device (e.g., accommodation of spatial changes occurring during charge/discharge, so as not to disrupt the overlap of interfaces between any two active components or layers of the energy storage device) through the manipulation of spatial features inherent to the starting housing substrate and implemented by the user during starting substrate processing.

The energy storage device housing units of one or more embodiments further enable control of each active energy component or layer through the independent sequential attachment, alignment, or deposition of hard or soft masks utilizing a lock-and-key or with chemically "dry" (non-slurry based), "wet" (slurry based) or hybrid (dry and wet) methods. These aspects of one or more embodiments solve the problem of enabling control of the dimensionality and deposition area of each active energy storage device layer or component.

Furthermore, one or more embodiments enable an in-wafer or "In-Silicon" design for the complete housing and sealing of active energy storage device components or layers that are electrically coupled with multiple TSV structures. This enables improved contact between the outside current collector and the internal energy storage device active layers due to the limiting trait of charge transfer magnitude being proportional with total electrochemically accessible surface area. Having two opposing current collectors on opposite sides of the silicon based energy storage device housing substrate eliminates the possibility of short circuiting the energy storage device, and hermetically seals the TSV type energy storage device.

Ever further, one or more embodiments enable an internal-side of a backside/bottom current collector metal to be utilized as both a hard, electrically conductive surface as well as a thermally conductive transfer material which facilitates the heating, annealing, synthesis, densification, and interlayer-adhesion when cold or hot-pressing active battery components or layers together in the 3D trench structure or when processing single active energy storage device layers in an independent fashion. Heat or an electrical bias may also be applied to the outside-portion of the backside current collector to facilitate the heating, annealing, synthesis, densification, and interlayer-adhesion, electrical activity, cold or hot-pressing of active battery components or layers together in order to achieve improved device performance via interfacial and bulk material properties. These aspects of one or more embodiments solve the problem of active energy storage device layer or component processing and treatment during interlayer integration, where processing techniques are often required at the beginning, middle, or end of the energy storage device's deposition/fabrication process in order to improve the working performance of energy storage devices. Furthermore, the ability for the energy storage housing/packaging/encapsulation structure seldom facilitates the physical 3-dimensional area where the active battery materials are contained, as well as the specific conductive or thermal control elements necessary for the integration of high performance interlayers and interfacial additive layers—as enabled by the present invention. Embodiments solve this problem by the above described in-situ treatment of active energy storage device components or layers as facilitated by the 3D structure and bottom current collector described above.

Embodiments further enable beneficial in-situ fabrication capabilities by utilizing the internal side of the backside current collector as a bottom contact during cold or hot-pressing of solid or semi-solid electrolytes, electrode/electrolyte composites, or any other component/layer of the active energy storage layers requiring cold or hot-pressing to achieve desired performance properties. Examples of performance properties include altering the crystal state of cathode ($LiCoO_2$) materials, reaching the glass-transition and densification temperature/conditions of solid electrolytes. Additionally, the invention described herein with the inherent TSV-enabled electrically and thermally conductive bottom current collect can enable the fabrication of advanced multi-layered electrode materials through the addition and processing, pressing, heating, and/or electrification of independent electrode layers. Furthermore, composite electrode fabrication can be facilitated by the current invention, where the relative compositional percentage of electrode material can be precisely determined by the above described independent layer deposition and processing, such that when examining the cross section of the completed composite electrode, the active electrode material, electrolyte material and/or interfacial additive material can vary with each layer applied—resulting in a completed composite electrode material that increases or decreases in the percentage of e.g., active electrode material as you go from top to bottom through the cross section of the material and where the inverse is true for the electrolyte material as you scan from top to bottom in the composite electrode. This process can be applied to layers independently (e.g., just cathode materials or just electrolyte materials) or on a multi-layered stack [e.g., $LiCO_2$ (bottom layer-in contact with the internal face of the backside current collector), $Al_2O_3$ (middle layer-in contact with both $LiCoO_2$ and electrolyte), and $Li_2S$—$P_2S_4$ (top-most layer in contact with only middle additive layer)].

The respective process may also be used to obtain various heating, pressure, annealing, densification, and interfacial adhesion changes that increase the energy storage device's working performance through an iterative, sequential heating/cooling/pressing process. One example of such a process is utilizing the internal face of the backside current collector, which only includes one material/active energy storage component or layer on it (e.g., a non-annealed $LiCoO_2$ cathode layer. The active energy storage component/layer may be hot pressed into the internal face of the backside current collector through the application of a fitted flat platen where the pressure is of the platen on the active material is applied from the topside of the 3D trench, while also heating the external side of the backside current collector with an externally applied heating source. Another example includes the application of a flat Teflon or Teflon coated platen which contains an interfacial additive on its bottom-of-trench facing platen; when this Teflon coated flat platen that contains an interfacial additive is in contact with the active battery material residing on the internal component of the backside current collector is heated, the interfacial additive layer adheres to the active battery material, as is facilitated by both temperature and pressure control of the system.

Such a method allows for the high temperature phase change of $LiCoO_2$ that improves its working performance as a cathode material in the completed energy storage device. Additionally, upon changing the cathode material to the high temperature phase the combined backside current collector and high temperature phase form $LiCoO_2$ that may be utilized as the "bottom platen" for hot or cold pressing solid electrolyte materials in order to alter their respective densification, glassy character, phase state, or crystal state. This improves their working performance in the completed active energy storage device. In the same manner, interfacial additives (e.g., $Al_2O_3$, $LiO-ZrO_3$, etc.) may be hot or cold pressed to improve interfacial adhesion, decrease internal resistance of the working cell, decrease charge-transfer resistance, decrease interfacial impedance and improve the working performance of the completed energy storage device. These aspects of one or more embodiments solves the problem of active energy storage device layer or component processing and treatment, which is often required at the beginning, middle or end of the energy storage device's deposition/processing/fabrication process in order to improve the working performance of energy storage devices. These aspects of one or more embodiments further solve this problem by the above discussed in-situ treatment of active energy storage device components or layers.

FIG. 1 shows a side cross-sectional view of a substrate 102 having trenches 104 to 110 formed therein. The substrate 102, in one embodiment, may be a non-porous silicon (Si)-based substrate, a single-crystal non-porous Si substrate, a low resistance doped (e.g., boron-doped) crystalline silicon material, a partially porous crystalline silicon material and/or the like. In one example, the substrate 102 may have a vertical thickness ranging from 5 µm to 1000 µm although other thicknesses are applicable as well. The horizontal width of the substrate 102 may vary such as based on a number of energy storage devices that are to be formed. A first set of trenches 104, 106 may be formed on the top side of the substrate 102 and a second set of trenches 108, 110 may be formed on the bottom-side of the substrate. The trenches 104 to 110 may be formed utilizing etching, such as deep reactive-ion etching (D-RIE), or wet etching methods utilizing chemicals such as hydrofluoric acid. More generally, any top-down method may be used to create the trenches 104 to 108 by etching or removing a desired amount of the silicon substrate 102. In one embodiment, the second set of trenches 108, 110 are formed by flipping the substrate over on a substrate holder and then performing the patterned etching process(es). As will be discussed in greater detail below, the first set of trenches 104, 106 will house multiple energy storage device layers and the second set of trenches 108, 110 will be utilizing for plating fill and metal contacts.

The first set of trenches 104, 106 may have a horizontal width ranging from less than 5 µm to greater than 1 mm, and a vertical thickness or height ranging from less than 5 µm to greater than 400 µm although other dimensions are applicable as well. In some embodiments, the trench depth does not exceed approximately three-fourths of the thickness of the substrate 102. Although in other embodiments the trench depth may be greater than three-fourths of the thickness while maintaining structural integrity. The trenches may be rectangular, circular, etc. as determined with the required shape of the desired form factor. The trenches 104, 106 may also include small x-sections, deep "vias", and/or the like. The second set of trenches 108, 110 may have a horizontal width ranging from less than 5 µm to greater than 1 mm, and a vertical thickness or height ranging from 100 nm to 100 um, although other dimensions are applicable as well, as determined by the desired function (electrical conduction, thermal conduction, mechanical robustness, etc.) of backside current collector.

FIG. 1 further that an electronic and ionic insulating layer (or multilayer) 112 is formed over and on the structure. The insulating layer 112 may be conformally deposited on the 3D patterned trenches 104, 106 of the substrate 102. The insulating layer 112 may be a single material (e.g. a material which is both electronic and ionic insulating), or multiple layered materials (e.g., an electronic insulating material and an ionic insulating material). Examples of materials that are both electronic and ionic insulating suitable for use as layer 112 include silicon nitride ($Si_3N_4$). For a layer 112 formed of multiple layers or materials, the electronic insulating material may be silicon dioxide ($SiO_2$) or $Si_3N_4$ and the ionic insulating material may be aluminum oxide (AlO) or thick (>200 nm) Lithium Fluoride (LiF) or silicon dioxide ($SiO_2$) or $Si_3N_4$.

It should be noted that, one or more embodiments, the insulating layer 112 (regardless of whether it is formed of a single or multiple materials or layers as described above) maintains a sufficient thickness to provide both electrical and ionic insulating properties after the energy storage device has been formed and while the energy storage device is in constant electrochemical use, enabled via the techniques described in further detail below. In other words, the layer (or multilayers) 112 should not lose too much thickness during the additional processing required for formation of the energy storage device (e.g., during the various etching steps or processes described below) as well as during electrochemical cycling. If significant thickness of the layer or multilayer insulating material is lost during these processes thicker insulating materials may need to be employed to maintain high energy storage device performance enabled through the isolation and insulation of the In-silicon energy storage device. Further, the material of layer 112 may be resistant to etching in HF mediums when employing porous silicon fabrication methods described above.

The insulating layer 112 may be deposited over the top of the FIG. 1 structure, using physical vapor deposition (PVD), atomic layer deposition (ALD), thermal oxide, chemical vapor deposition (CVS) or any other suitable oxide deposition processing technique. Upon deposition, the insulating layer 112 covers the top surface of the substrate 102 and the sidewalls and bases of the trenches 104, 106. The insulating layer 112 may have a uniform thickness such as in the range of less than 100 nm to greater than 600 nm.

Figure 2:
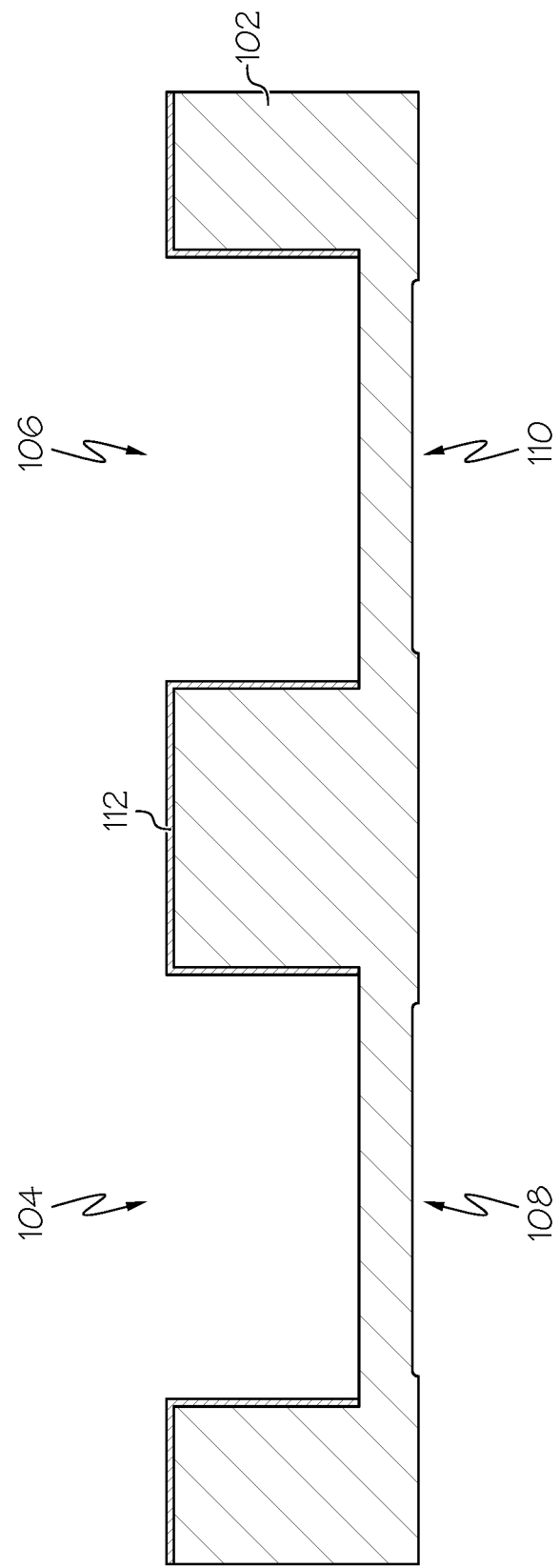
FIG. 2 is a cross-sectional view of the semiconductor structure after the electronic and ionic insulating layer(s) has been removed from the base of the plurality of trenches according one embodiment of the present invention.

FIG. 2 shows that the insulating layer 112 is removed from the base of the trenches 104, 106. The insulating layer 112 at the base of the trenches 104, 106 may be removed using etching, such as reactive-ion etching (RIE) and/or wet etching (e.g. using HF) to form patterned insulating layers 112. Removal of the insulating material from the base of the trenches 104, 106 enables an electrical, as well as potentially ionic, connection between the backside of the substrate 102 and active battery material that is later filled in the trenches 104, 106. A resist or masking layer may be patterned on the top surface of the substrate and sidewalls of the trenches 104, 106 to protect the insulating layer 112 formed thereon during removal of the insulating material from the base of the trenches 104, 106. For example, hard masks (e.g., steel, mylar, etc.) or soft masks (e.g., photoresist materials) can be utilized to protect the top of the substrate 102 and sidewalls of the trenches 104, 106 during removal of the insulating material from the base of the trenches 104, 106.

Figure 3:
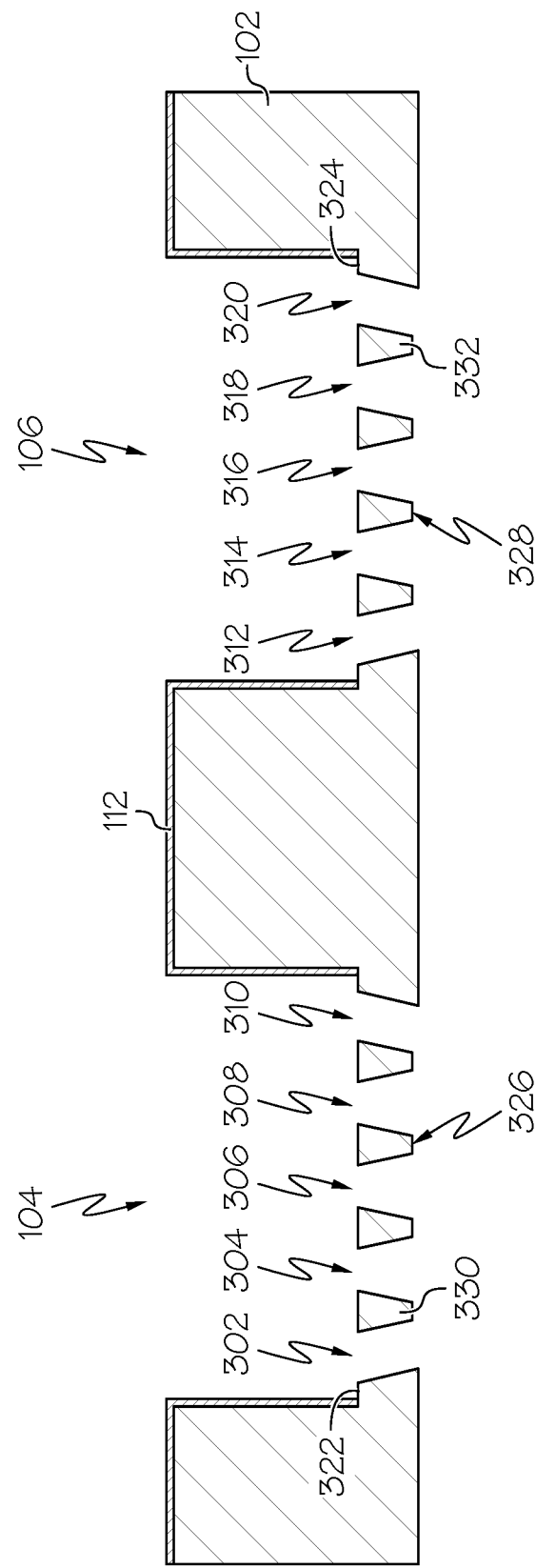
FIG. 3 is a cross-sectional view of the semiconductor structure after a plurality of through silicon vias have been formed in a base of each trench according one embodiment of the present invention.
Figure 4:
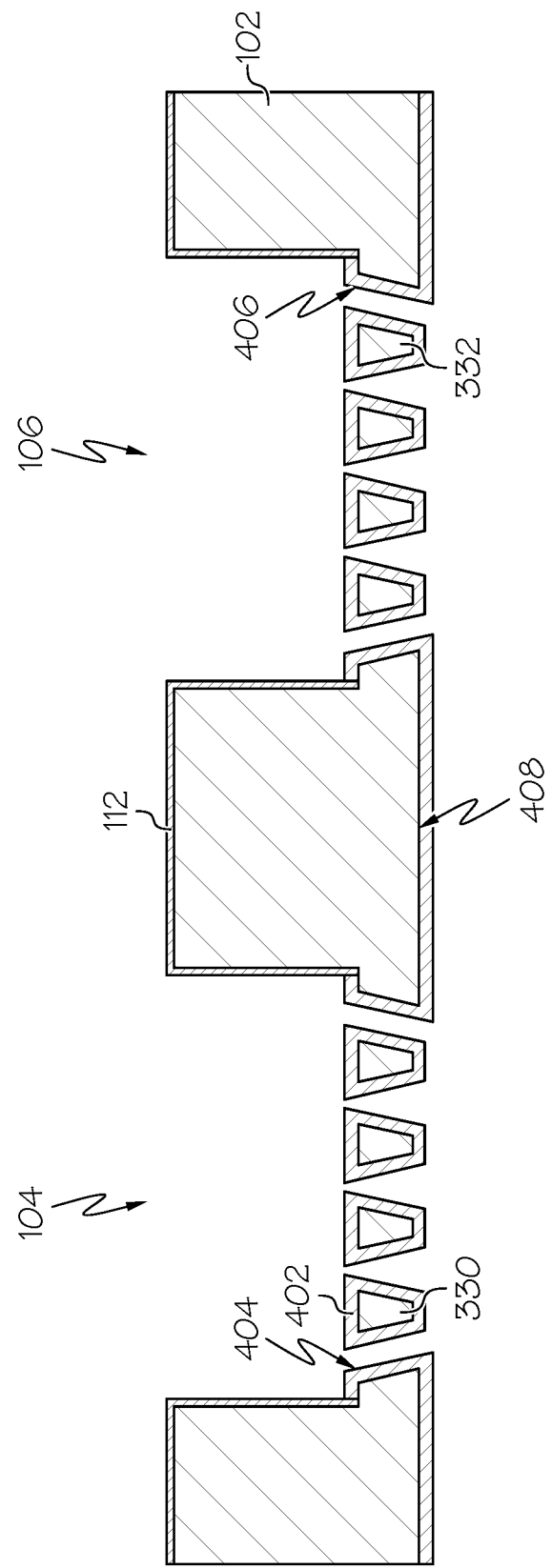
FIG. 4 is a cross-sectional view of the semiconductor structure after an adhesion layer has been formed according one embodiment of the present invention.

FIG. 3 shows that after the trenches 104 to 110 and insulating layer 112 are formed a plurality of vias 302 to 320 (referred to as a "through silicon vias (TSVs) 302, 304") is formed through a portion of the substrate (e.g., base of trench) within each trench 104 to 110. The vias 302 to 320 may be formed by a Deep Reactive Ion Etching (D-RIE) process or through the base 322, 324 of the trench 104, 106 through the bottom surface 326, 328 of the trench portions of the substrate 102 standard hard (metal) or soft (patterned photoresist) mask materials are deposited in order to protect the areas of the substrate not intended to be etched. The via diameters can range from less than 5 μm to greater than 50 μm. The via depths can range from less than 15 μm to greater than 130 μm. The via frequency can range from 1 via to greater than 1 via (e.g., 3 vias, 4 vias, etc.). The via formation process etches the base of the trench 104, 106 into a plurality of inter-via islands 330, 332 separated by the plurality of via voids 302 to 320.

FIG. 3 shows that after the TSVs 302 to 320 have been formed, an adhesion layer 402 is applied/formed surrounding the inter-via islands 330, 332, and is further formed on and in contact with any remaining portion of the base of the trench; via sidewalls 404, 406; and the backside 408 of the substrate 102. The adhesion layer 402 may be conformally deposited on the substrate field and sidewalls utilizing ALD, CVD, PVD, and/or the like. The adhesion layer 402 may comprise titanium nitride (TiN), tantalum nitride (TaN), a combination of the two, and/or the like and may have a uniform thickness, of less than 10 nm up to greater than 100 nm, with a preferred range of such as in the range of 15 nanometers (nm) to 100 nm.

After the adhesion layer 402 has been formed, formation of energy storage device layers and current collectors occurs. In one embodiment, the energy storage device layers and current collectors are formed utilizing "lock-and-key" style independent masks, also referred to as shadow masks, that are designed to fit in the trenches 104, 106 (e.g., energy storage device containment features) to facilitate formation of the active components the devices. The shadow masks may be "hard" masks (e.g., formed of a metal such as steel, stainless steel, polymer coated stainless steel, silicon, etc.) that may be physically deposited and lifted from the structure, or "soft" masks (e.g., formed of a resist material such as photopolymeric, photodecomposing, photocrosslinking photoresist, hydrocarbon/organic composition based resist materials, etc.) that may be deposited and removed chemically.

The depth that each mask reaches into the trenches 104, 106 is based on how much "fill" of each component of the energy storage device is desired to be deposited into the trenches 104, 106. As each layer fills the trenches 104, 106, the depth of the shadow masks decreases. The masks protect and prevent undesired or uncontrolled formation of the various energy storage device components on sidewalls of the trenches 104, 106 during wet (e.g., slurry, etc.), dry (e.g., atomic layer deposition (ALD) or sputtering, etc.) and hybrid methods of deposition of such components.

Figure 5:
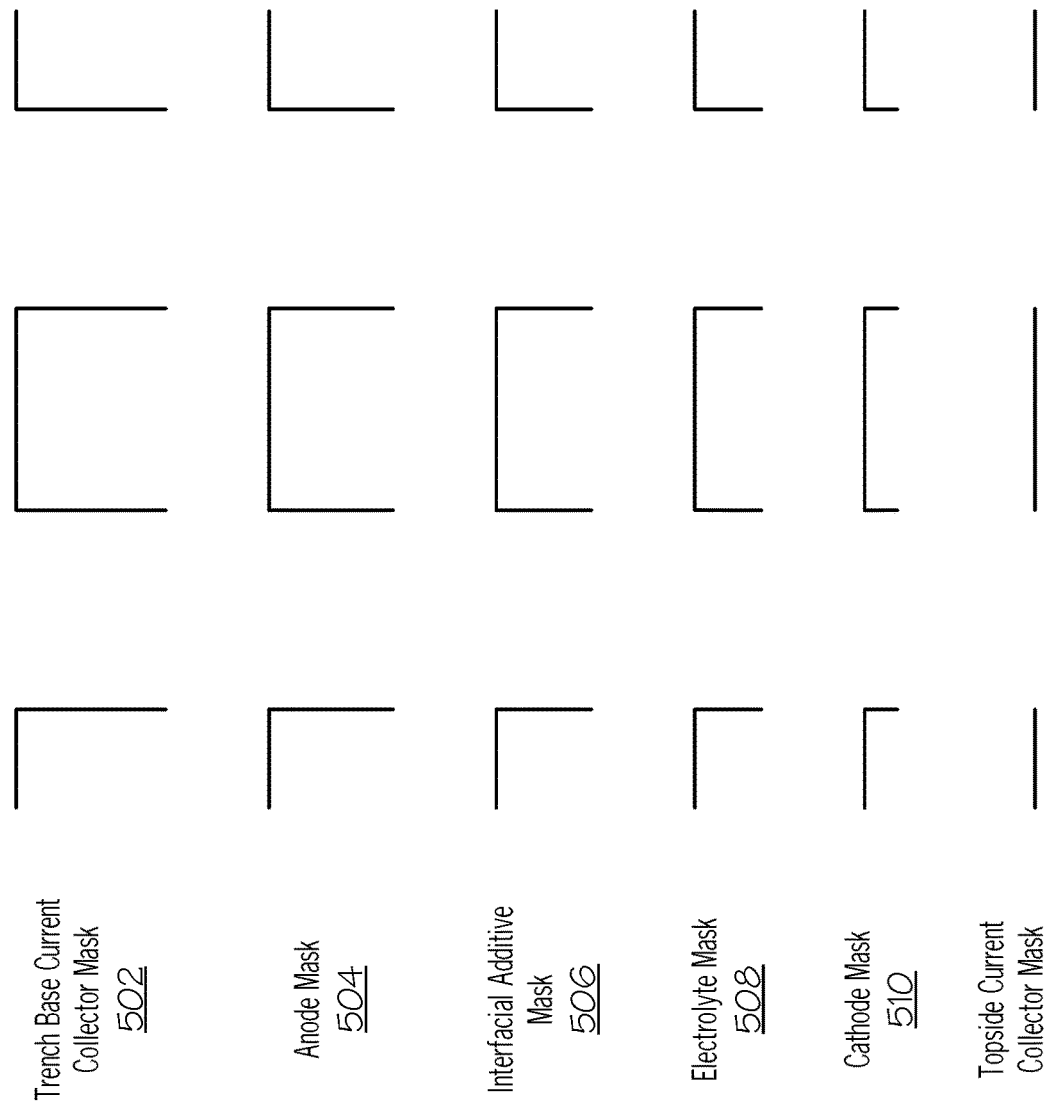
FIG. 5 illustrates various mask features that may be utilized to form various layers of an energy storage device according one embodiment of the present invention.

FIG. 5 shows various examples of shadow masked utilized to form the energy storage device layers and current collectors of each energy storage device. In one embodiment, a trench base current collector mask 502 is used for deposition of a seed layer (layers 702, 704 of FIG. 7) and formation of a trench base current collector (e.g., backside contact layers 802, 804 of FIG. 8); an anode mask 504 used for formation of the anode or active electrode layer (e.g., anode layers 902, 904 of FIG. 9), an interfacial additive mask 506 used for formation of an interfacial additive layer (e.g., interfacial additive layers 906, 908 of FIG. 9); an electrolyte mask 508 used for formation of the electrolyte layer (e.g., electrolyte layers 910, 912 of FIG. 9); a cathode mask 510 used for formation of a cathode or active electrode layer (e.g., cathode layers 918, 920 of FIG. 9); and a current collector mask 512 used for formation of a topside current collector (e.g., topside current collectors 926, 928 of FIG. 9).

Figure 6:
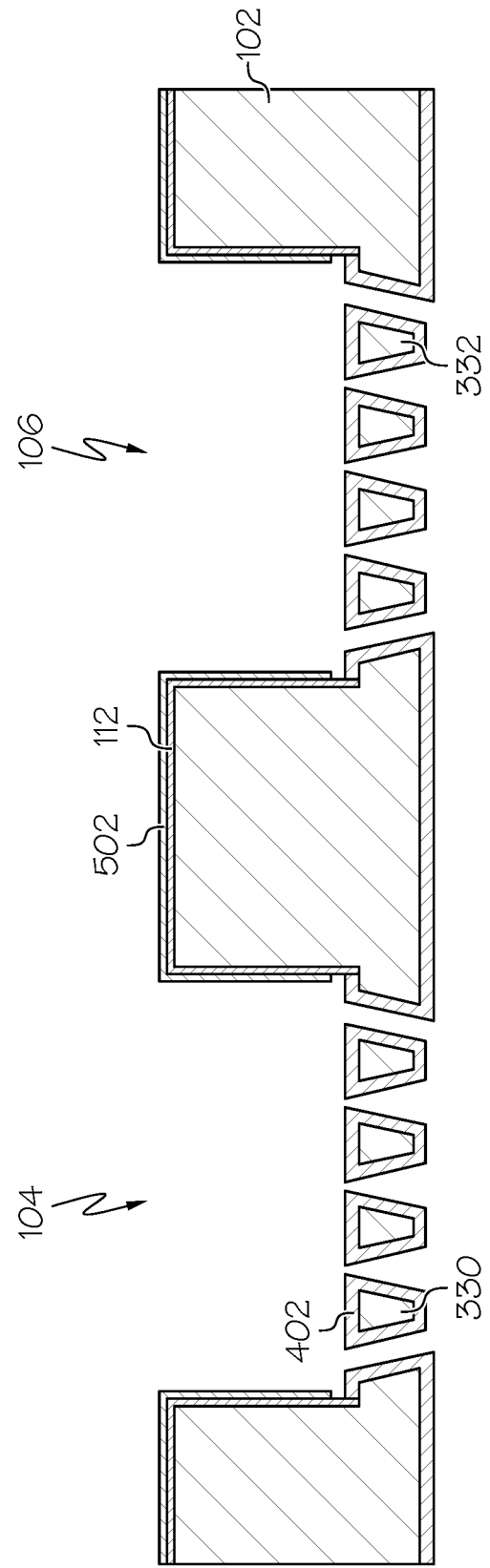
FIG. 6 is a cross-sectional view of the semiconductor structure after a shadow mask has been utilized to facilitate the filling of the through silicon via features with a conductive metal according one embodiment of the present invention.

FIG. 6 shows one example of utilizing shadow masks to form trench base current collector layers for each energy storage device. In one embodiment, a trench base current collector mask 502 is formed in contact with portions of the insulating layer 112 that are on the top surfaces of the substrate 102 and sidewalls of the trenches 104, 106. A portion of insulating layer 112 at the bottom of the trench sidewalls remains exposed. For example, if the trench sidewalls are 300 μm high then the depth of the trench base current collector mask 502 may be 260 μm leaving 40 μm of the insulating layer 112 exposed. If a planarized trench base collector spanning the length and width or a partial length and width of the trench base, which will eventually be of unitary composition with the metal in the vias, is desired the portion of the trench base which will include this planarized layer is removed of all insulation materials. This may be accomplished by utilizing the trench base current collector mask 502 while the etching (e.g., RIE) process ensues in order to protect the desired remaining insulation layer(s).

Figure 7:
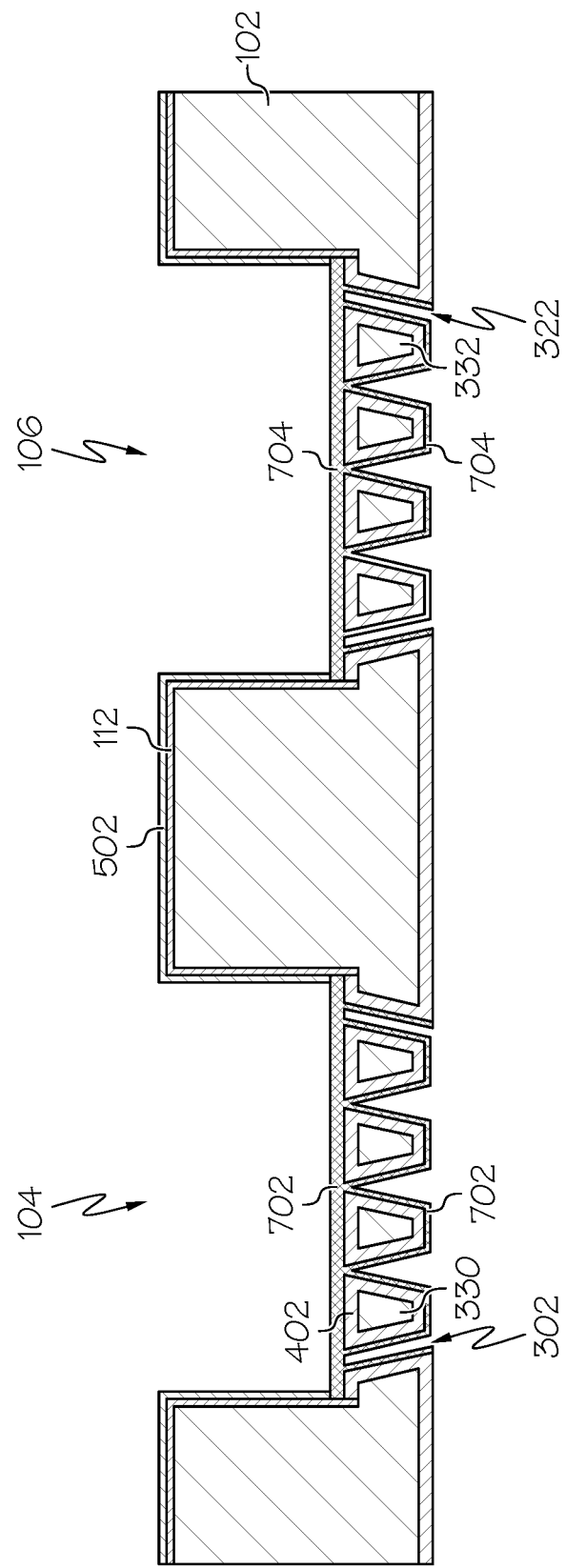
FIG. 7 is a cross-sectional view of the semiconductor structure after a seed layer has been formed within the vias according one embodiment of the present invention.

FIG. 7 shows that a metal seed layer 702, 704 may then be formed on and in contact with the adhesion layer 402 at the base of the trenches 104, 106 and in the vias 302 to 302 surrounding the inter-via islands 330, 332. The metal seed layer 702, 704 may be formed utilizing one or more deposition methods such as PVD and topside and/or backside deposition angles. The metal seed layer 702, 704 may comprise copper (Cu) or another suitable material such as nickel (Ni), aluminum (Al), titanium (Ti), tungsten (W), platinum (Pt), gold (Au), a suitable composite material such as nickel-copper composite materials, titanium, platinum, nickel, and/or the like. The metal seed layer 702, 704 may have a thickness of, for example, 10 to 300 nm, with a preferred thickness range of 15 to 100 nm, although other thicknesses are applicable as well. The trench base current collector mask 502 prevents the metal seed layer 702, 704 from being deposited on unwanted portions of the structure.

Figure 8:
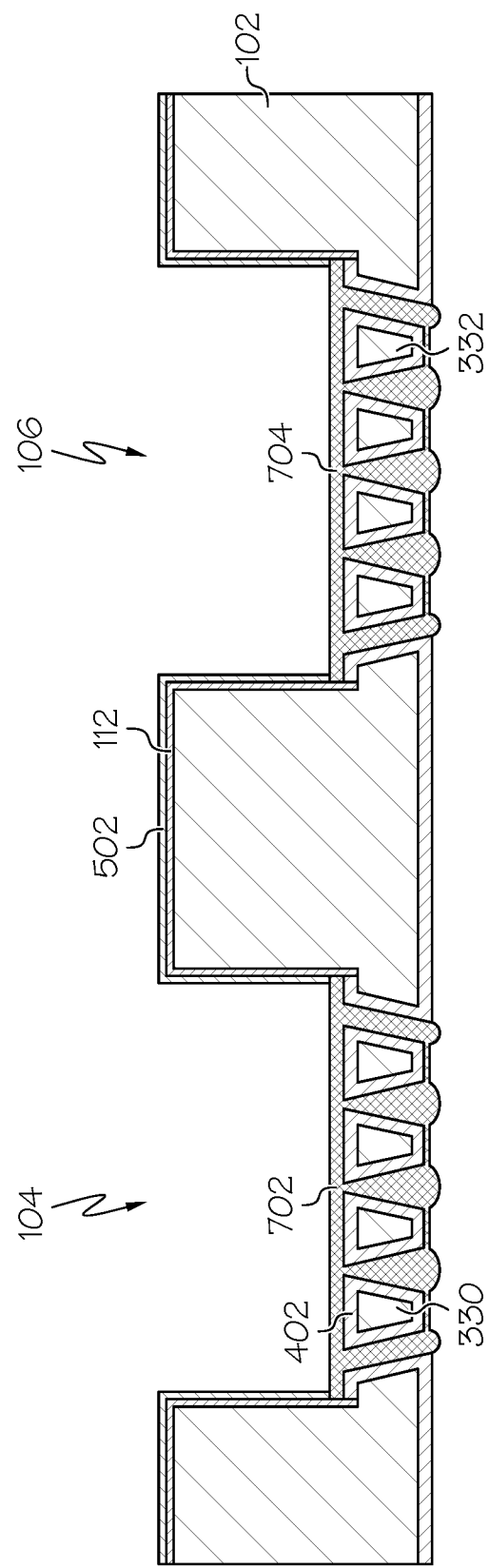
FIG. 8 is a cross-sectional view of the semiconductor structure after the through silicon vias have been filled with conductive metal as through the utilizing the seed layer deposition of FIG. 7 one embodiment of the present invention.
Figure 9:
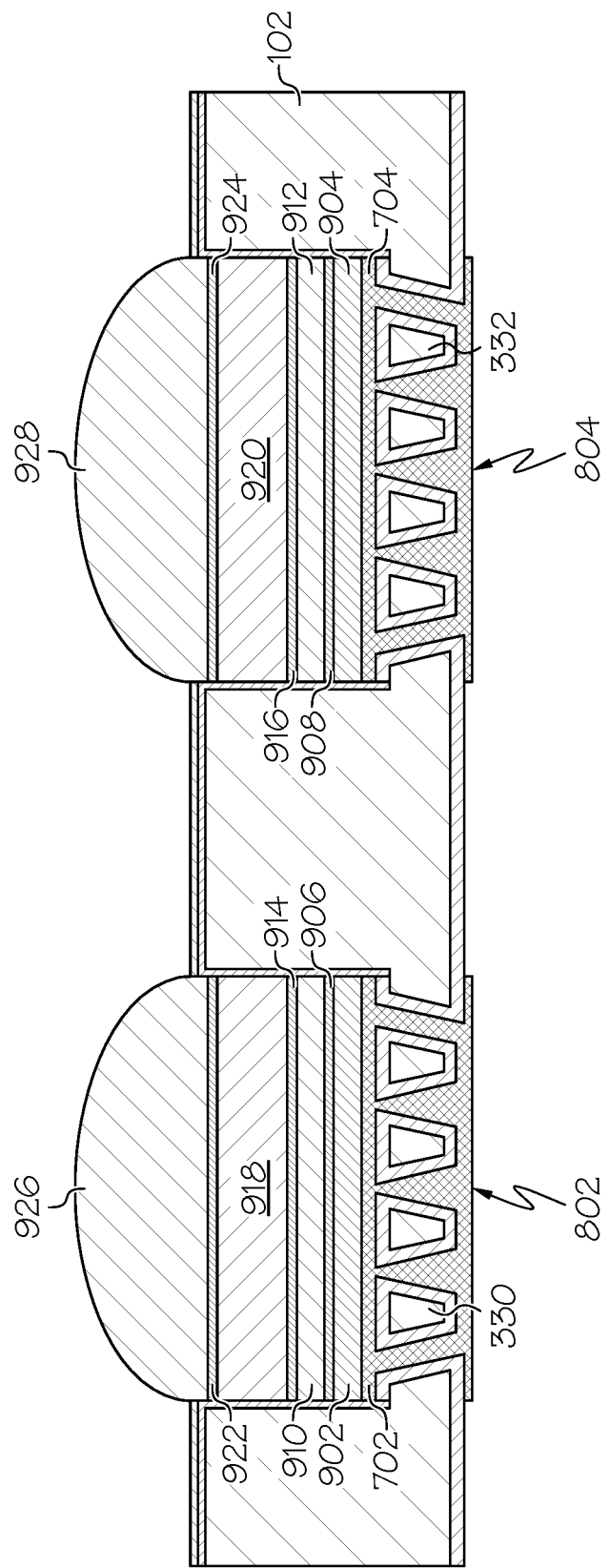
FIG. 9 is a cross-sectional view of the semiconductor structure after formation of various energy storage device layers according one embodiment of the present invention.

FIGS. 8 and 9 show that via-filled backside current collector layers 802, 804 for each energy storage device may be formed by dry deposition of metal into the TSVs 302 to 320 and/or metal electroplating (e.g., electrochemical deposition) utilizing the seed layer 702, 704. This deposition process(es) fills the TSVs 302 to 320 with the metal material. The material at the base of trench and backside of substrate may then be metal planarized (FIG. 9) to create platens, which form a trench base current collector layers 702, 704 and backside current collector layers 802, 804. The vias 302 to 320 connect both platen/collector layers. Alternatively, the backside metal material may by planarized at a later point in time such as after one or more additional energy storage device layers have been formed. Once the collector layer 702, 704, 802, 804 have been formed the mask 502 is removed using physical or chemical processes, and the shadow mask for the next energy storage device layer (e.g., the anode layer) is deposited similar to the trench base current collector mask 502. This process is continued for each energy storage device layer.

For example, FIG. 9 shows an anode layer 902, 904; a first additive interfacial layer 906, 908 formed on and in contact with the anode layer; an electrolyte layer 910, 912 formed on and in contact with the first interfacial additive layer 906, 908; a second interfacial additive layer 914, 916 formed on and in contact with the electrolyte layer 910, 912; a cathode layer 918, 920 formed on and in contact with the second additive interfacial layer 914, 916; a third additive interfacial layer 922, 924 formed on and in contact with the cathode layer 918, 920; and a topside current collector layer 926, 928 formed on and in contact with the third additive interfacial layer 922, 924. FIG. 9 also shows the topside current collector mask 512 having been formed on portions of the insulation layer 302 in contact with the top surface of the substrate 102. Each of these layers are formed by first depositing their respective shadow mask, depositing their respective material(s), and then removing their shadow mask once the layer has been formed. It should be noted that the cathode layer 918, 920 may comprise multiple layers. In this embodiment, a separate interfacial additive layer may be situated between and in contact with each of these layers. A separate shadow mask may be utilized for each these interfacial additive layers. In a similar fashion, this methodology can also be applied to several anode layers, as well as electrolyte layers.

The first active electrode (anode) layer 902, 904 may be formed of charge-containing anode metals/materials. Non-limiting examples of charge-containing anode metals/materials include evaporated lithium (Li) metal, molten Li metal, Li powder, Li powder/carbon composites, lithium powder/carbon/solid electrolyte composite, lithium metal/carbon/polymer electrolyte/plasticizer composite, lithium metal/conductive agent electrolyte/plasticizer composite, lithium containing compound/conductive agent electrolyte/additive (plasticizer and/or interfacial impedance mitigating material) composite, and/or any other suitable charge-hosting anode material(s). The anode-electrolyte interfacial layer 906, 908 formed at the anode (e.g., first active electrode layer 902, 904)-electrolyte (e.g., electrolyte layer 910, 912) interface may be formed of aluminum oxide ($Al_2O_3$), lithium niobium oxide, lithium fluoride, silicon dioxide, or any other hard/robust material that has an electrical and lithium conductivity which is tunable with respect to thickness. The anode-electrolyte interfacial layer 906, 908 may be deposited using evaporation type, PVD and/or in-situ electrochemical deposition, melting, sintering, casting, plating-type, or any combination of processing techniques thereof. The anode-electrolyte interfacial layer 906, 908 may have a vertical thickness (in direction Y-Y') ranging from less than 10 nm to greater than 1 μm, where many of the robust electrically insulative materials (e.g. SiO2 and Al2O3 have an exemplary thickness of less than 5 nm).

The electrolyte layer 910, 912 may be formed of a liquid, solid or semi-solid material such that it is ionically conducting to lithium yet also maintains a very low conduction with respect to electrons, and which requires or does not require an additionally electrically separating material (a separator such as polyacrylonitrile (PAN)). The electrolyte layer 910, 912 may be formed of, for example, a solid electrolyte such as lithium phosphorus oxynitride (LiPON), although other suitable materials such as dilithium sulfide ($Li_2S$), lithium phosphorus sulfide ($Li_3PS_4$), lithium germanium phosphorus sulfide ($Li_{10}GeP_2S_{12}$), lithium tin sulfide ($Li_4SnS_4$), lithium phosphorus sulfide chloride ($Li_6PS_4Cl$), lithium titanate oxide ($Li_4Ti_5O_{12}$), lithium zirconium oxide ($Li_2ZrO_3$), lithium lanthanum zirconium oxide ($Li_7LaZr_2O_{12}$), lithium germanium oxide ($Li_4GeO_4$), lithium niobate ($LiNbO_3$), lithium germanium phosphate ($LiGe_2(PO_4)_3$), lithium titanium phosphate ($LiTi_2(PO_4)_3$), lithium oxide chloride ($Li_3OCl$), lithium bromide (LiBr), lithium magnesium bromide ($Li_2MgBr_4$), lithium aluminum bromide ($LiAlBr_4$), lithium zirconium bromide ($Li_2ZnBr_4$), lithium manganese bromide ($Li_2MnBr_4$), lithium chloride (LiCl), lithium magnesium chloride ($Li_2MgCl_4$), lithium zirconium chloride ($Li_2ZnCl_4$), lithium aluminum chloride ($LiAlCl_4$), lithium cadmium chloride ($Li_3CdCl$), lithium fluoride (LiF), lithium yttrium fluoride ($LiYF_4$), lithium aluminum fluoride ($Li_3AlF_6$), lithium argon fluoride ($Li_2ArF_6$), lithium aluminum germanium phosphate (LiAlGe($PO_4$)$_3$) (LAGP), lithium lanthanum argon oxide ($Li_7La_3Ar_2O_{12}$) (LLZO), lithium super ionic conductor (thio-LISICON) electrolytes such as $Li_{2+2x}Zn_{1-x}GeO_4$, lithium germanium phosphorus sulfide ($Li_{3.25}Ge_{0.25}P_{0.75}S_4$), lithium phosphorus sulfur chloride ($Li_6PSCl$), lithium phosphorus sulfur bromide ($Li_6PSBr$), lithium phosphorus sulfur iodine ($Li_6PSI$), (Repeat) lithium sulfide-phosphorus sulfide ($Li_2S$—$P_2S_4$), lithium phosphorus sulfide ($Li_7P_3S_{11}$), lithium lanthanum argon niobium oxide ($Li_{6.75}La_3Ar_{1.75}Nb_{0.25}O_{12}$, gel polymers, ceramics, solid polymer electrolytes such as LiTFSI salt formulated with varying ratios of polycaprolactone and succinonitrile, Sol-Gel formulations, lithium aluminum titanium phosphate ($Li_{1.3}Al_{0.3}Ti_{1.7}(PO_4)_3$) or more generally any LiAlTi($PO_4$), any combination of varying $Li_2S$ to $P_2S_4$ percent combinations, lithium nitride ($Li_3N$), lithium boron nitride ($Li_3BN_2$), lithium nitride chloride ($Li_4NCl$), lithium hydride (LiH), lithium boron hydride ($Li_3B_4$), lithium barium hypochlorite ($Li_xBa_yO_{1+z}Cl_{1-2z}$), or any other feasible electrolyte which performs the function of electrolyte active layers (high Li-ion conductivity & low electrical conductivity) in a stable or semi-stable (e.g., low interfacial resistance) fashion and contains hardness properties that prevent or semi-prevent the penetration of lithium based dendrites through the bulk of the electrode/electrolyte/electrode cell when utilized in energy storage devices, may be used.

Additional examples of electrolyte materials and their formation are discussed in commonly owned U.S. patent application Ser. No. 16/032,317, entitled "In-silicon energy storage devices containing integrated porous silicon electrodes", filed on Jul. 11, 2018; and commonly owned U.S. patent application Ser. No. 16/238,319, entitled "Fabrication Of All-Solid-State Energy Storage Devices", filed on Jan. 2, 2019, which are hereby incorporated by reference in their entireties.

The electrolyte layer 910, 912 may be deposited using PVD, chemical vapor deposition (CVD), hot pressing (e.g., thermally controlled mechanical pressurization), hot pressing under vacuum conditions (e.g., thermally controlled pressurization in controlled vacuum conditions), slurry-based casting, pressing and drying, sol-gel type or in-situ formation of the interfacial layer through electrochemical deposition processing, etc. The electrolyte layer 910, 912 may have a vertical thickness (in direction Y-Y') ranging from less than 25 nm to greater than 1 µm.

The cathode-electrolyte interfacial layer 914, 916 formed at the electrolyte (e.g., electrolyte layer 910, 912)-cathode (e.g., active electrode layer 918, 920) interface may be formed of lithium phosphorus oxygen (LiPO), aluminum oxide ($Al_2O_3$), lithium niobium oxide (LiNbO), lithium conductive plasticizer material such as succinonitrile (SN) or another suitable material such as gold (Au), indium (In), lithium silicon composites or any other such material which can be conformally deposited on the electrolyte and/or cathode and successfully facilitate the adhesion between the cathode (e.g., second active electrode 918, 920) and electrolyte (e.g., electrolyte layer 910, 912) (such as plasticizing and/or ceramic-seeded, Li-conducting interposer materials) while also maintaining high Li-ion conductivity. The cathode-electrolyte interfacial layer 914, 916 may be deposited using PVD, CVD, hot pressing (e.g., thermally controlled mechanical pressurization), hot pressing with under vacuum conditions (e.g., thermally controlled pressurization in controlled vacuum conditions), or in-situ formation through electrochemical deposition processing. The cathode-electrolyte interfacial layer 914, 916 may have a vertical thickness (in direction Y-Y') ranging from less than 5 nm to greater than 15 nm.

The second active electrode layer (cathode) 918, 920 may form the cathode of the resulting energy storage device. The second active electrode layer electrode 918, 920 may be formed of lithium cobalt oxide ($LiCoO_2$) (LCO) or another suitable material such as lithium manganese oxide ($LiMn_2O_4$) (LMO), lithium manganese oxyflouride ($Li_2MnO_2F$), lithium nickel manganese cobalt oxide (LiNiMnCoO$_2$) (NMC), lithium manganese nickel oxide ($LiMn_{1.5}Ni_{0.5}O_4$), lithium iron phosphate ($LiFePO_4$), lithium iron manganese phosphate ($LiFeMnPO_4$), lithium nickel cobalt aluminum oxide ($LiNiCoAlO_2$) (NCA), lithium nickel manganese cobalt oxide (NMC), lithium iron phosphate-lithium cobalt oxide ($LiFePO_4$—$LiCoO_2$), lithium iron phosphate-lithium manganese oxide ($LiFePO_4$—$LiMn_2O_4$), lithium vanadium phosphate-lithium manganese phosphate ($Li_3V_2(PO_4)_3$—$LiMnPO_4$), or conversion/alloying type cathodic materials such as lithium sulfur based cathode materials or any suitable cathode materials which can maintain relatively high capacity as well as power density capabilities as set by the industrial standards for the time.

The second active electrode layer 918, 920 may be deposited using PVD, CVD, hot pressing (e.g., thermally controlled mechanical pressurization), hot pressing with under vacuum conditions (e.g., thermally controlled pressurization in controlled vacuum conditions), slurry-based casting, drying & pressing, sol-gel type or in-situ formation of the interfacial layer through electrochemical deposition processing. The second active electrode layer electrode layer 918, 920 may have a vertical thickness (in direction Y-Y') ranging from less than 300 nm to greater than 150 µm.

The topside current collector 926, 928 may be formed of copper (Cu) or another suitable material such as nickel (Ni), aluminum (Al), titanium (Ti), tungsten (W), platinum (Pt), gold (Au), a suitable composite material such as nickel-copper composite materials, etc. The topside current collector 926, 928 may be deposited using PVD, ALD, evaporation, mechanical, thermo-mechanical processing, etc. The topside current collector 926, 928 may have a horizontal width (in direction X-X') which matches that of the underlying second active electrode layer 918, 920 (as shown), or has a smaller or larger surface area than that of the underlying electrode and a vertical thickness (in direction Y-Y') which does not impede its mechanical robustness, adhesion properties or conductive properties under electrochemical conditions, such as ranging from less than 500 nm to greater than 50 µm, depending on the nature of the current collector and the desired performance properties.

Figure 10:
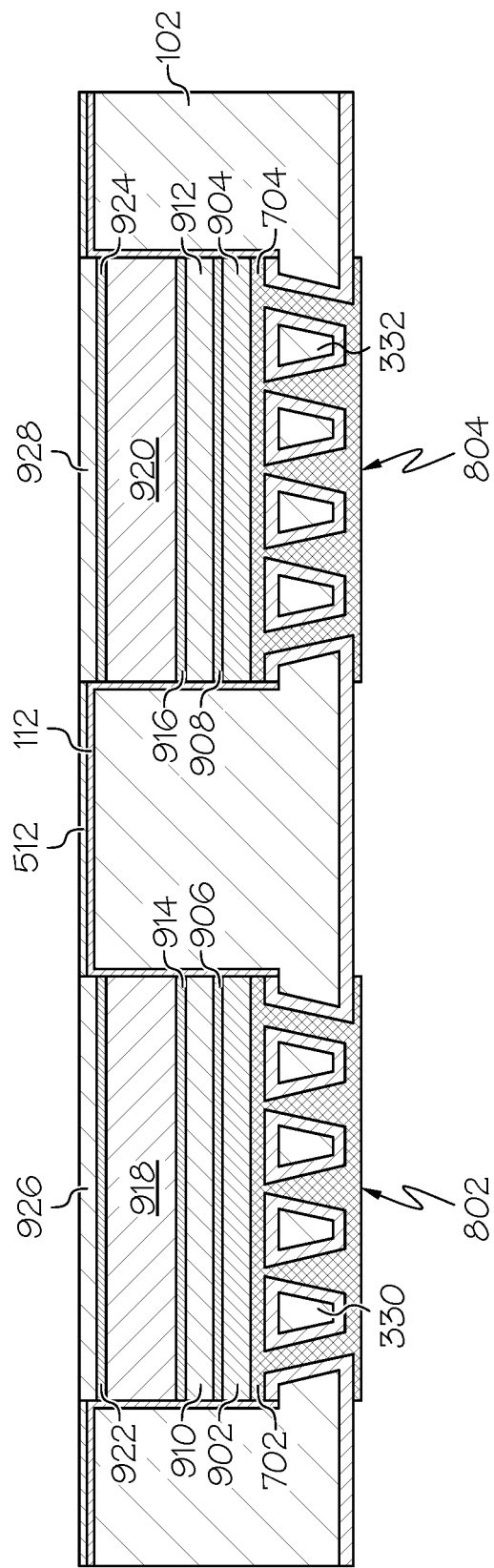
FIG. 10 is a cross-sectional view of the semiconductor structure after grinding/polishing of opposing topside and backside current collectors has been performed according one embodiment of the present invention.
Figure 11:
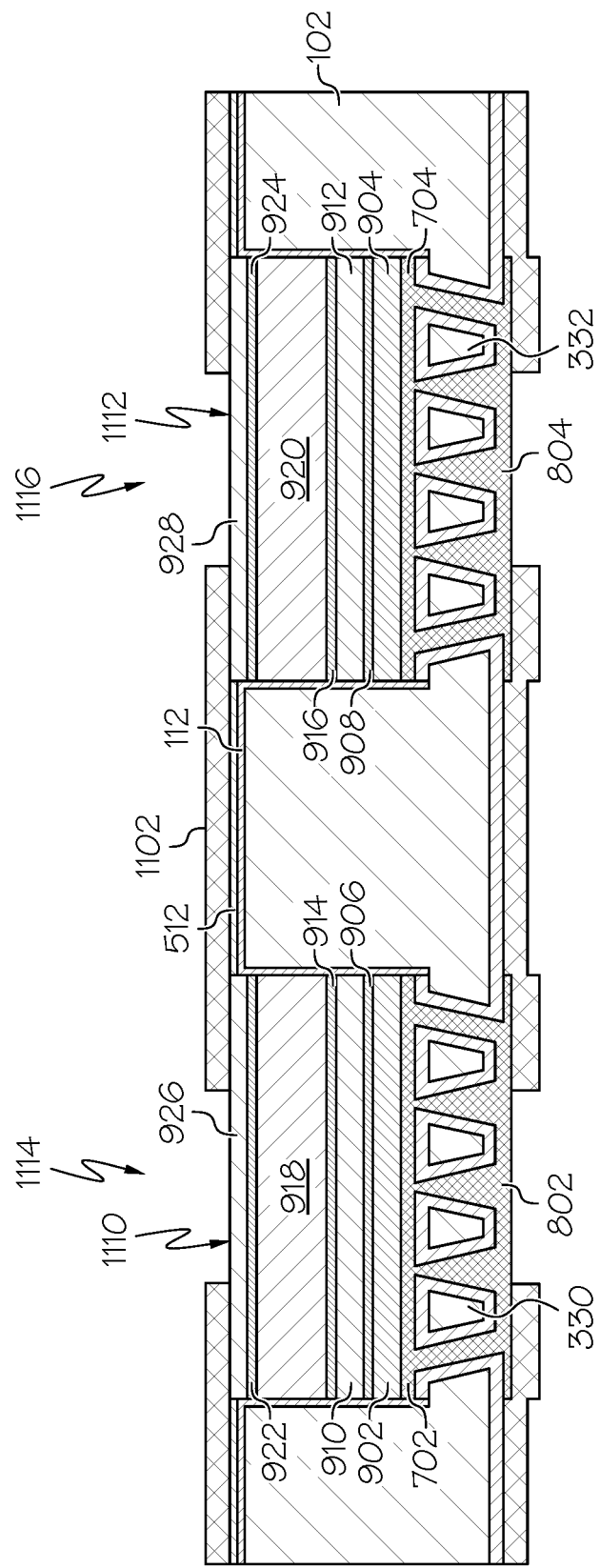
FIG. 11 is a cross-sectional view of the semiconductor structure after an encapsulation layer has been formed according one embodiment of the present invention.

FIG. 10 shows the structure after the energy storage device layers have been formed. FIG. 11 shows that encapsulation (environmental protection) layers 1102, 1104 are then formed on the topside and backside of the substrate 102. In one embodiment, the encapsulation layers 1102, 1104 are formed by first forming a mask (not shown) over and in contact with at least a portion of the backside current collectors 802, 804 and the topside current collectors 926, 928. The masked-off areas prevent one or more portions of the current collectors 802, 804, 926, 928 that are to be subsequently utilized for connection to external leads from being covered by the encapsulation layers 1102, 1104.

Encapsulation layers 1102, 1104 are then formed using, for example, sputtering deposition of silicon nitride, spin coating and/or curing of non-conductive polymer sealants (e.g., parylene) or any other process by which the energy storage device may be patterned coated with a non-conductive hermetically sealing material. At this point, the encapsulation layers 1102, 1104 surrounds the device or at least covers edge portions of devices. The encapsulation layers 1102, 1104 may be formed in contact with at least the insulation layer 112 on the top surface and bottom surface of the substrate 102 and a portion of the current collectors 802, 804 and 926, 928.

The encapsulation layers 1102, 1104 may comprise hard and/or soft materials such as, but not limited to, silicon nitride, polymer materials, metal-based materials, composite materials (such as $SiO_2$ layer followed by $Si_3N_4$, or $Si_3N_4$ layer followed by a layer of aluminum-based material followed by polymer-based material (e.g., parylene) where several iterations of this multilayer/3-fold layering process can occur, etc.). The vertical thickness (in direction Y-Y') of the encapsulation layers 1102, 1104 may in the range of less than 500 nm to greater than 10 µm.

After the encapsulation layers 1102, 1104 have been formed, the masks are removed to expose the underlying portion 1106 to 1112 of the current collectors 802, 804 and 926, 928, as shown in FIG. 11. The resulting structure is an in-silicon energy storage device housing comprising a plurality of encapsulated TSV energy storage devices 1114, 1116. The TSV energy storage devices 1114, 1116 may be separated into independent energy storage devices using a dicing and/or cleaving process. For example, various processes, including but not limited to saw cutting (e.g., with a diamond saw or other suitable tool), cleaving (e.g., through the substrate 102), laser cutting, etc. In some embodiments, two or more energy storage devices may be kept together during separation from a remainder of the structure. It should be noted that although the above embodiments show a bottom-up anode to cathode fabrication process a bottom-up cathode to anode fabrication is also applicable as well as discussed in the commonly owned U.S. patent application Ser. No. 16/238,319, entitled "Fabrication Of All-Solid-State Energy Storage Devices", filed on Jan. 2, 2019.

Figure 12:
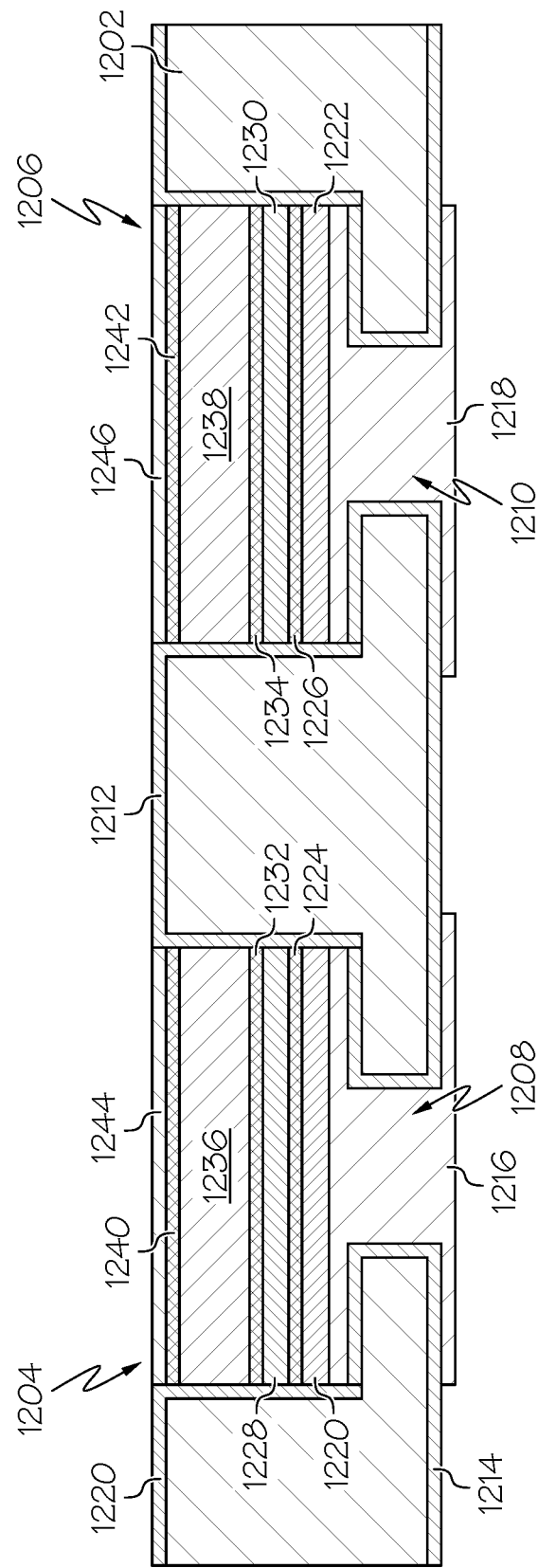
FIG. 12 is a cross-sectional view of another semiconductor structure comprising an energy storage device containment feature having a single through silicon via according one embodiment of the present invention.

Although FIGS. 1-11 show a plurality of TSVs 302 to 320, one or more embodiments are also applicable to a single TSV. For example, FIG. 12 shows one example of and in-silicon energy storage device housing formed from a substrate 1202. A plurality of trenches 1204, 1206 are formed within the substrate 1202 similar to that discussed above with respect to FIG. 1. FIG. 12 also shows that a single TSV 1208, 1210 is formed within each trench using deep RIE. An insulating layer 1212 is formed surrounding and in contact with the substrate 102 similar to that discussed above with respect to FIGS. 1 and 2. An adhesion layer 1214 is formed in contact with the base of the trenches 1204, 1206, sidewalls of the vias 1208, 1210, and the bottom surface of the substrate 1202 similar to that discussed above with respect to FIG. 4. A bottom current collector 1216, 1218 is formed within the single trenches 1204, 1206 similar that discussed above with respect to FIGS. 7 and 8. The anode layer 1220, 1222; first interfacial additive layer 1224, 1226; electrolyte layer 1228, 1230; second interfacial layer 1232, 1234; cathode layer 1236, 1238; third interfacial layer 1240, 1242; and the topside current collector 1244, 1246 are then formed similar to that discussed above with respect to FIGS. 9 and 10. An encapsulation layer (not shown) may be formed on these layers similar that discussed above with respect to FIG. 11.

Figure 13:
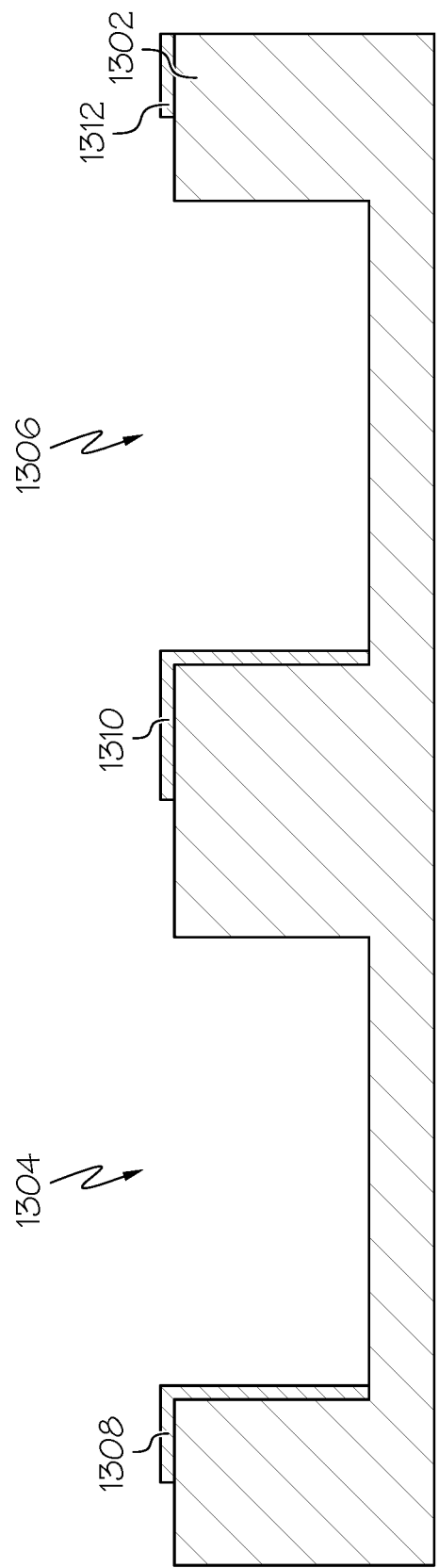
FIG. 13 is a cross-sectional view of another semiconductor structure after a plurality of trenches have been formed in a substrate and masking materials have been deposited in order to pattern portions of the trenches according one embodiment of the present invention.

In some embodiments, TSVs are not created within the substrate 102 for each of the energy storage device housing units. For example, FIG. 13 shows a substrate 1302 having trenches 1304, 1306 formed therein similar to the substrate of FIG. 1. FIG. 13 further shows an shadow masks 1308 to 1312 having been formed on and in contact with one of the sidewalls of each trench 1304, 1306 and also on and in contact with a portion of the top surfaces of the trenches 1304, 1306. The shadow masks 1308 to 1312 are similar to the shadow masks discussed above with reference to FIGS. 5 and 6.

Figure 14:
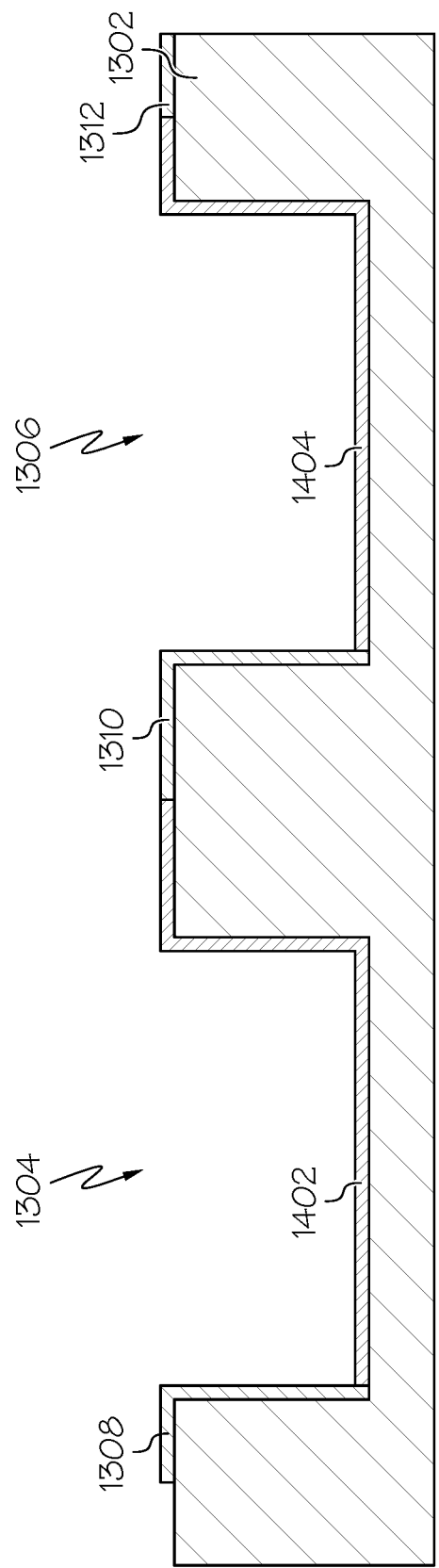
FIG. 14 is a cross-sectional view of the semiconductor structure of FIG. 13 after a bottom current collector has been formed on a base portion, inner sidewall, and top surface of the trenches according one embodiment of the present invention.

FIG. 14 shows that after the shadow masks 1308 to 1312 have been formed, a bottom current collector 1402, 1404 is formed in contact with the base portion of the trench 1304, 1306; the exposed sidewall of the trench 1304, 1306; and the exposed portion of the top surfaces of the trench 1304, 1306. The masks 1308 to 1312 prevent the trench base collector material from forming on the masked portions of the trenches 1304, 1306. The bottom current collector 1402, 1404 may include any metallic electrode-specific compatible material such as, for example, titanium (Ti), platinum (Pt), nickel (Ni), copper (Cu), aluminum (Al), copper/nickel composites or titanium nitride (TiN). The bottom current collector 1402, 1404 may include a layer of a metallic electrode-specific compatible material, or a multi-layer of at least two different metallic electrode-specific compatible materials.

The bottom current collector 1402, 1404 may have a thickness from less than 100 nm to greater than 10 µm depending on the conductive and physical properties of the metal material(s), as determined by the desired energy storage device. Other thicknesses that are lesser than, or greater than, the aforementioned thickness values may also be used for the bottom current collector 1402, 1404. The bottom current collector 1402, 1404 may be formed utilizing a deposition process including, for example, chemical vapor deposition (CVD), plasma enhanced chemical vapor deposition (PECVD), evaporation, sputtering, plating, or mechanically attached metallic foil. For improved contact resistance, alloying of the metallic electrode-specific compatible material with a semiconductor material base may be performed. Alloying may be achieved by performing a silicidation process as is known to those in the semiconductor industry. Once the bottom current collector 1402, 1404 has been formed, the masks 1308 to 1312 may be removed similar to the masks discussed above with respect to FIGS. 5 and 6.

Figure 15:
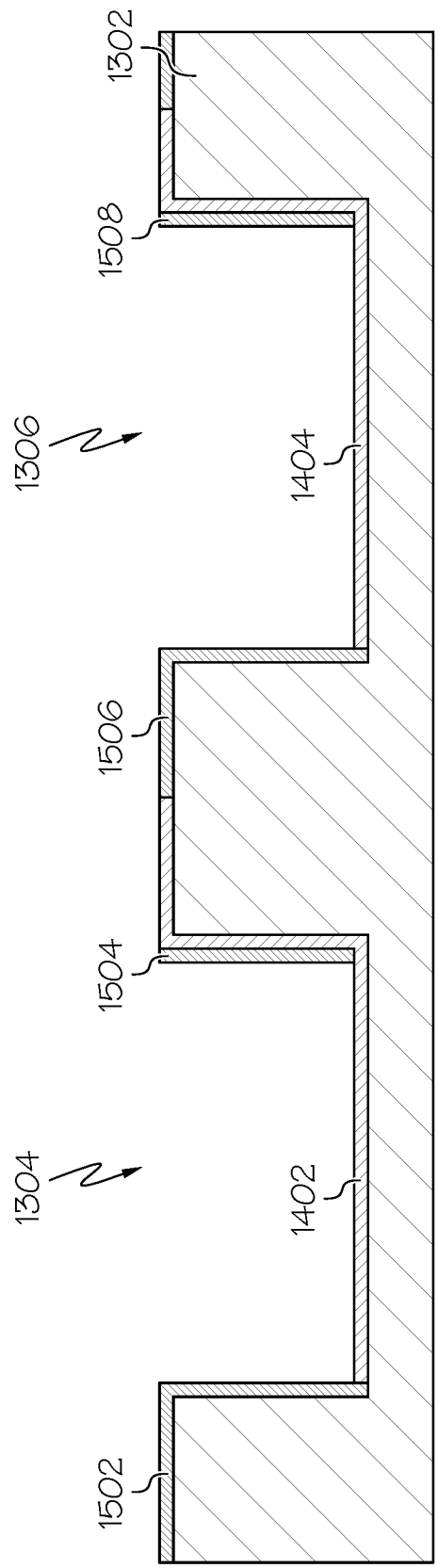
FIG. 15 is a cross-sectional view of the semiconductor structure of FIG. 14 after electronic and ionic insulating material(s) has/have been formed on portions of the trenches according one embodiment of the present invention.

FIG. 15 shows that after the bottom current collector 1402, 1404 has been formed and the masks 1308 to 1312 removed, electronic and ionic insulating layers (or multi-layers) 1502 to 1508 is/are formed on the structure of FIG. 14. In one embodiment, the insulating layers 1502 to 1508 are formed on and in contact with exposed sidewalls and top surface portions of the trenches 1304, 1306 and vertical portions of the bottom current collector 1402, 1404. The insulating layer or multilayers 1502 to 1508 are similar to the insulating layer 112 of FIG. 1 and may be formed using similar processes. An etching process such as RIE and patterning masks may be used to remove unwanted portions of the insulating layers 1502 to 1508 after deposition.

Figure 16:
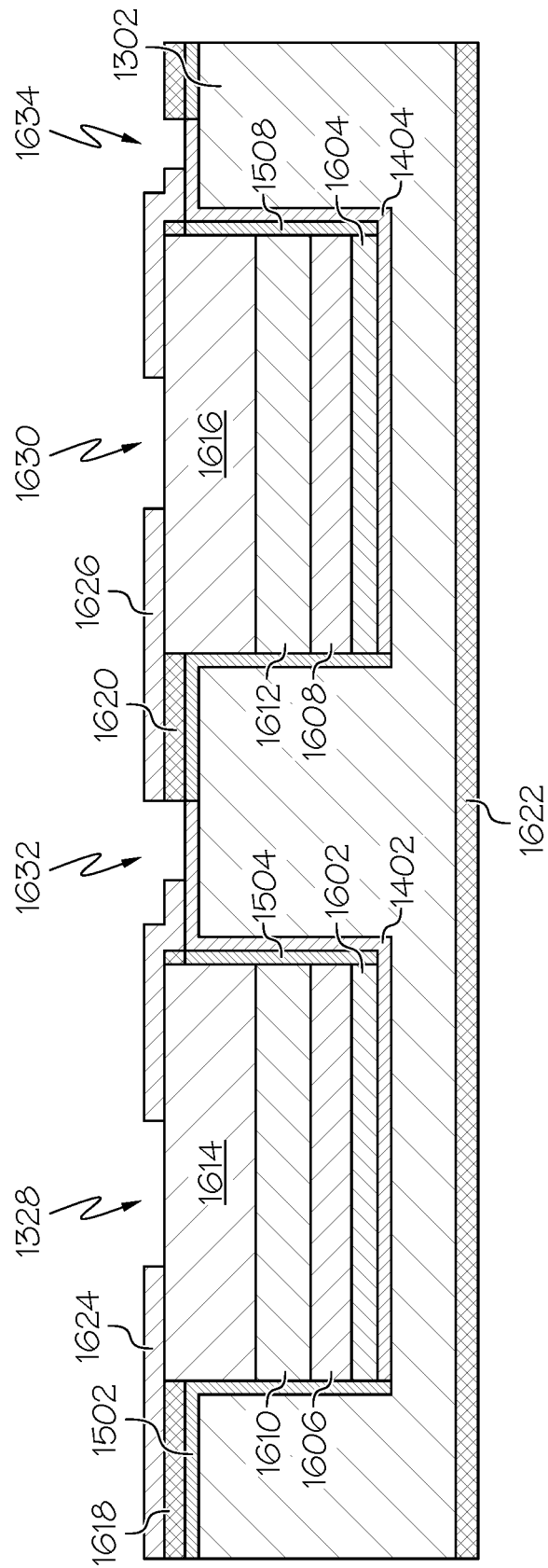
FIG. 16 is a cross-sectional view of the semiconductor structure of FIG. 15 after additional energy storage device layers have been formed according one embodiment of the present invention.

FIG. 16 shows the structure of FIG. 15 after additional layers have been formed for the energy storage devices. These additional layers include an active electrode or anode layer 1602, 1604; electrolyte layer 1606, 1608; an active electrode or cathode layer 1610, 1612; a top-side current collector or metal contact 1614, 1616; an encapsulation layers 1618; a backside encapsulation layer 1622; and additional encapsulation layering 1624, 1626. The additional encapsulation layering 1624, 1626 provide for better isolation of current collectors and patterning of contact points 1628 to 1634. Each of these layers may be formed using processes similar to those discussed above with respect to FIGS. 9-11. These layers may also comprise materials similar to those discussed above with respect to layers 902 to 928, 1102, and 1104. In some embodiments, interfacial additive layers (not shown) similar to those discussed above with respect to FIG. 9 may also be formed.

In the embodiment shown in FIG. 16, the top current collector 1614, 1616 extends above a top surface of the trenches 1304, 1306. In one embodiment, the top surface of the encapsulation layers 1618, 1620 and the top surface of the top current collectors 1614, 1616 are coplanar. The encapsulation layers 1618, 1620 may contact a top surface of the horizontal portions of the insulating spacer layers 1502 to 1508 and sidewalls of the top current collector 1614, 1616. The encapsulation layer 1618 may be patterned such that the (horizontal) portions 1624, 1626 of the bottom current collector 1402, 1404 on the top surface of the trenches 1304, 1306 remains exposed.

One advantage of the embodiments show in FIGS. 13-16 is the positioning and patterning of the top and bottom current collectors as well as their insulation layer determined contact points for externally connected leads. This is important such that both contacts are easily accessible from the topside of the substrate. In addition, there should be no risk of both the top and bottom current collectors touching each other via a conductive medium that would short the device.

Figure 17:
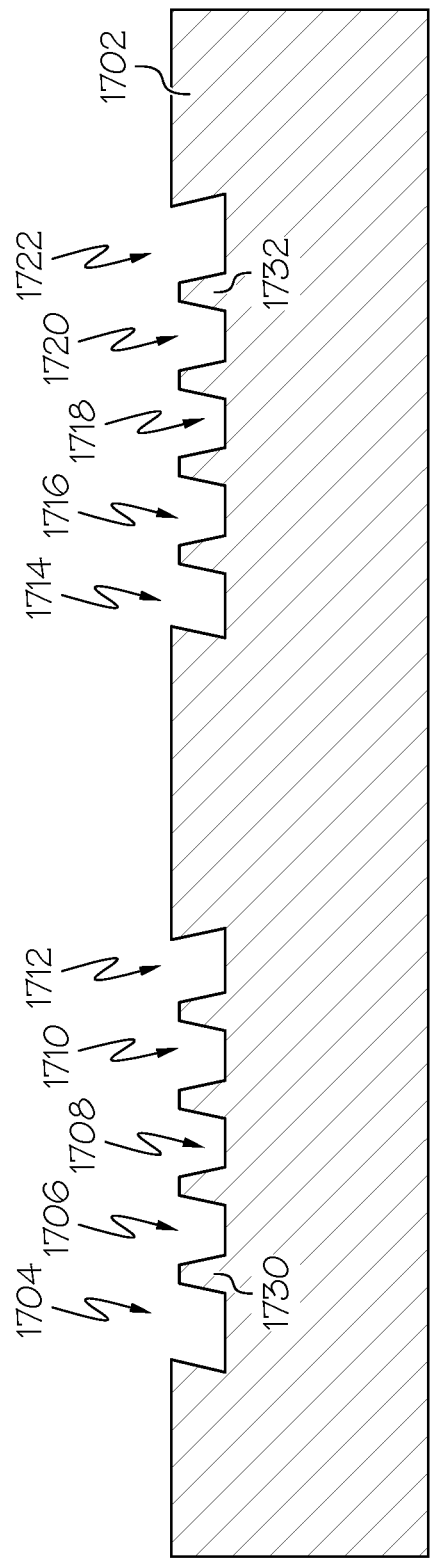
FIG. 17 is a cross-sectional view of a semiconductor structure according to another embodiment where a plurality of through silicon vias are formed in a backside of a silicon substrate prior to formation of the plurality of trenches.
Figure 18:
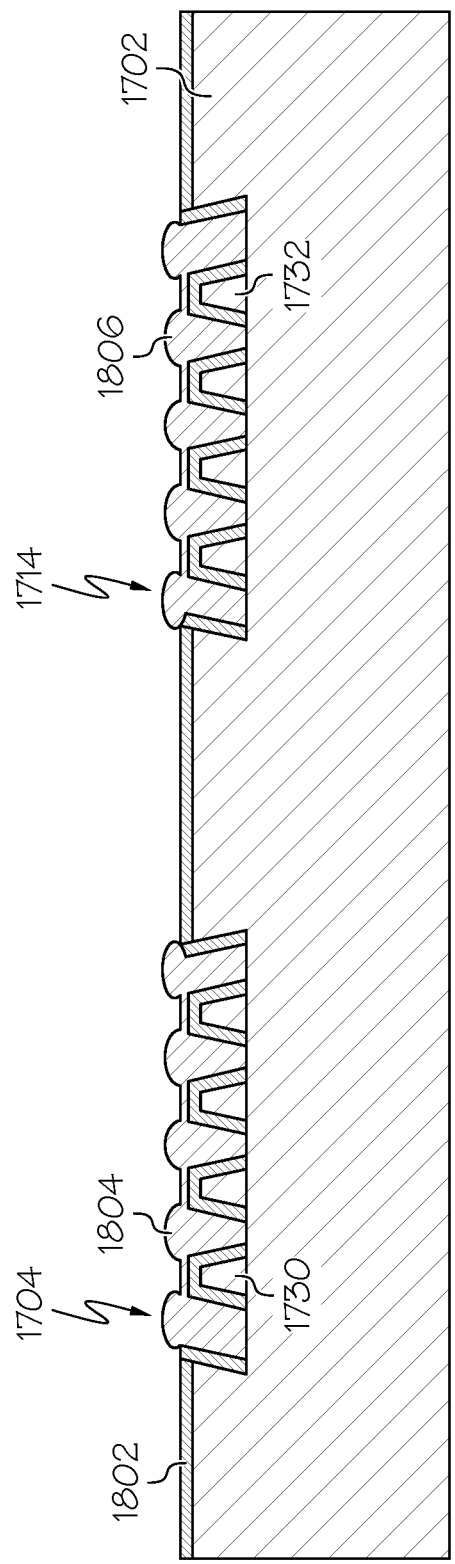
FIG. 18 is a cross-sectional view of the semiconductor structure of FIG. 17 after the plurality of vias have been filled with a metal material according one embodiment of the present invention.
Figure 19:
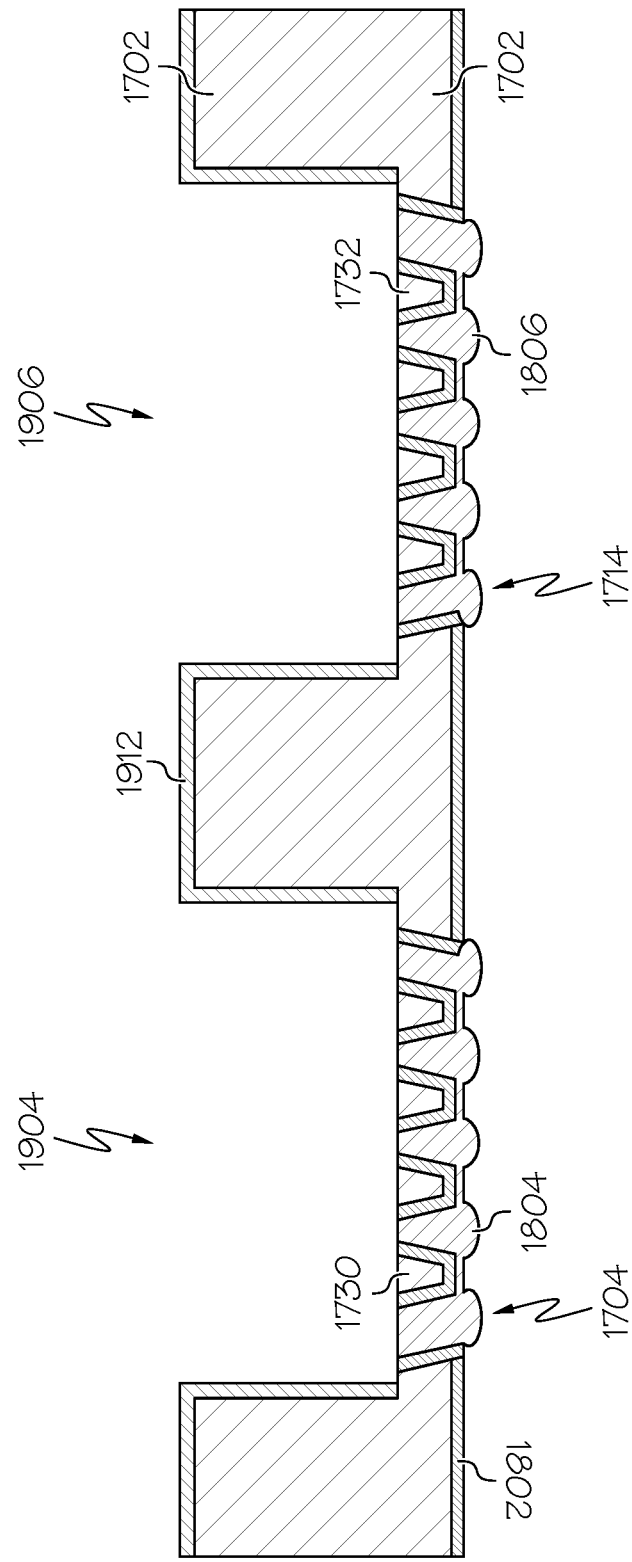
FIG. 19 is a cross-sectional view of the semiconductor structure of FIG. 18 after plurality of trenches have been formed through a topside of the silicon substrate and exposes the plurality of vias and metal material according one embodiment of the present invention.

FIGS. 17-19 show another embodiment where TSVs are formed prior to the trenches. For example, FIG. 17 shows that the substrate 1702 has been flipped over and TSVs 1704 to 1722 have been formed within the backside of the substrate 1702 using a process similar to that discussed above with respect to FIG. 3. The via formation process etches a portion of the backside of the substrate 1702 into a plurality of inter-via islands 1730, 1732 separated by the plurality of via voids 1704 to 1722. An adhesion layer 1802 is formed on the surface of the substrate 1702, the horizontal surface of the inter-via islands 1730, 1732, and sidewalls of the inter-via islands 1730, 1732 using a process similar to that discussed above with respect to FIG. 4.

A metal seed layer seed is deposited within the vias 1704 to 1722 similar to that discussed above with respect to FIG. 7. FIG. 18 shows that a backside current collector 1806, 1808 for each energy storage device may be formed by dry deposition of metal into the vias 1704 to 1722 and/or metal electroplating (e.g., electrochemical deposition) utilizing the seed layer. This deposition process(es) fills the vias 1704 to 1722 with the metal material. After the vias 1704 to 1722 have been filled with the metal material the substrate 1702 is flipped over, as shown in FIG. 19. FIG. 19 also shows that trenches 1904, 1906 and isolation layers 192 are formed for each energy storage device using processes similar to those discussed above with respect to FIGS. 1 and 2. Metal material similar to the material within the vias 1704 to 1722 may then be deposited at the base of the trenches 1904, 1906 using the shadow mask of FIG. 6. The backside metal layer and trench base metal layer may then be planarized to form the platens discussed above with respect to FIG. 8. The remaining energy storage device layers are then formed as discussed above with respect to FIGS. 9-11.

Figure 20:
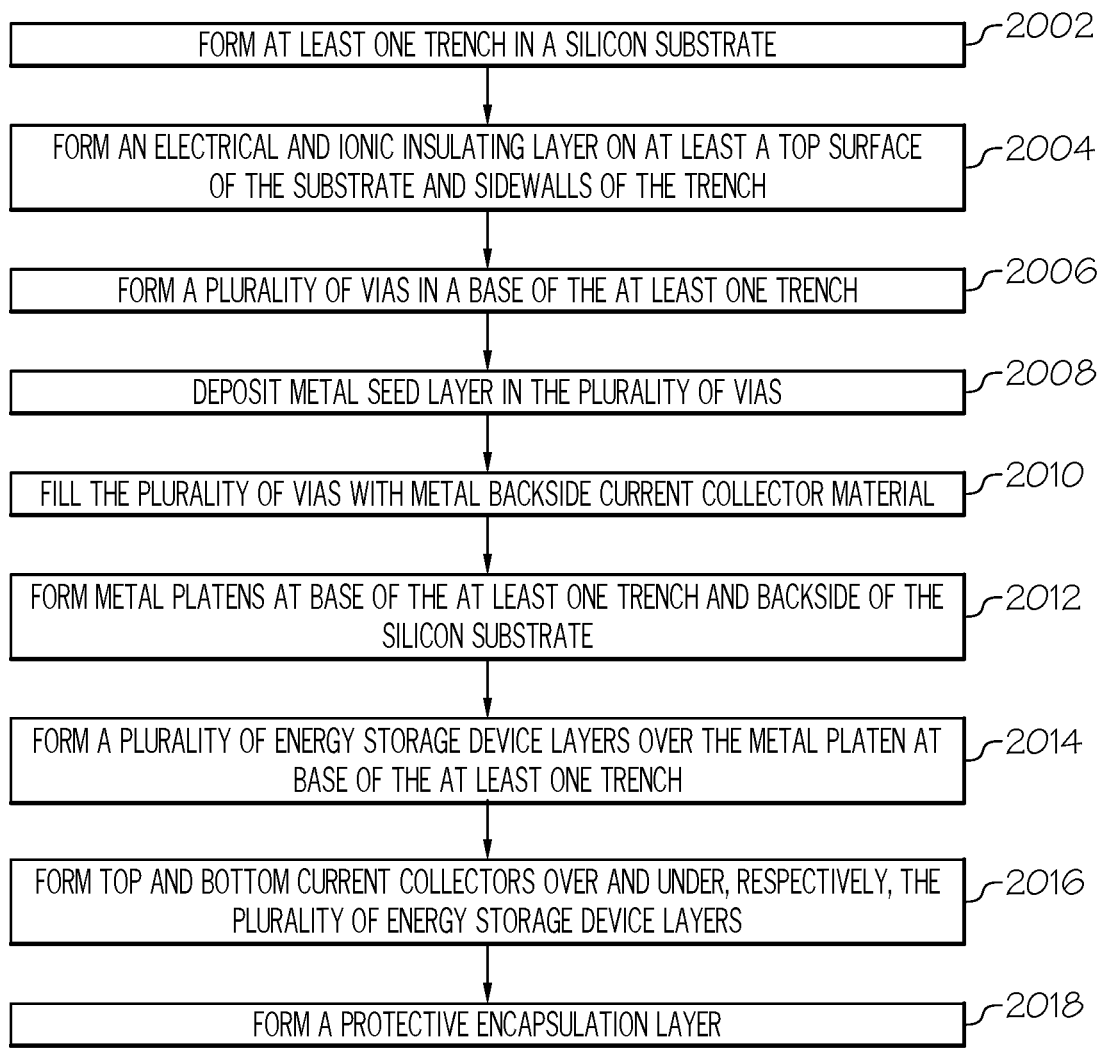
FIG. 20 is an operational flow diagram illustrating one example of a process for forming a semiconductor device structure comprising an energy storage device containment feature according one embodiment of the present disclosure.

FIG. 20 is an operational flow diagram illustrating one example of a process for forming an energy storage device. It should be noted that each of the steps shown in FIG. 20 has been discussed in greater detail above with respect to FIGS. 1-12. At least one trench, at step 2002, is formed in a silicon substrate. The at least one trench provides an energy storage device containment feature. An electrical and ionic insulating layer, at step 2004, is formed on at least a top surface of the substrate and sidewalls of the trench. A plurality of vias, at step 2006, is formed in a base of the at least one trench. A metal seed layer, at step 2008, is deposited in the plurality of vias. The plurality of vias, at step 2010, is filled with a metal backside current collector material utilizing the metal seed layer. It should be noted that the vias may be formed and filled with metal material prior to the formation of the trenches, as discussed above. Metal platens, at step 2012, are formed at the base of the at least one trench and backside of the silicon substrate. A plurality of energy storage device layers, at step 2014, is formed over the metal platen at the base of the at least one trench. Top and bottom current collectors, at step 2016, are respectively formed over and under the plurality of energy storage device layers. A protective encapsulation layer, at step 2018, may then be formed.

Figure 21:
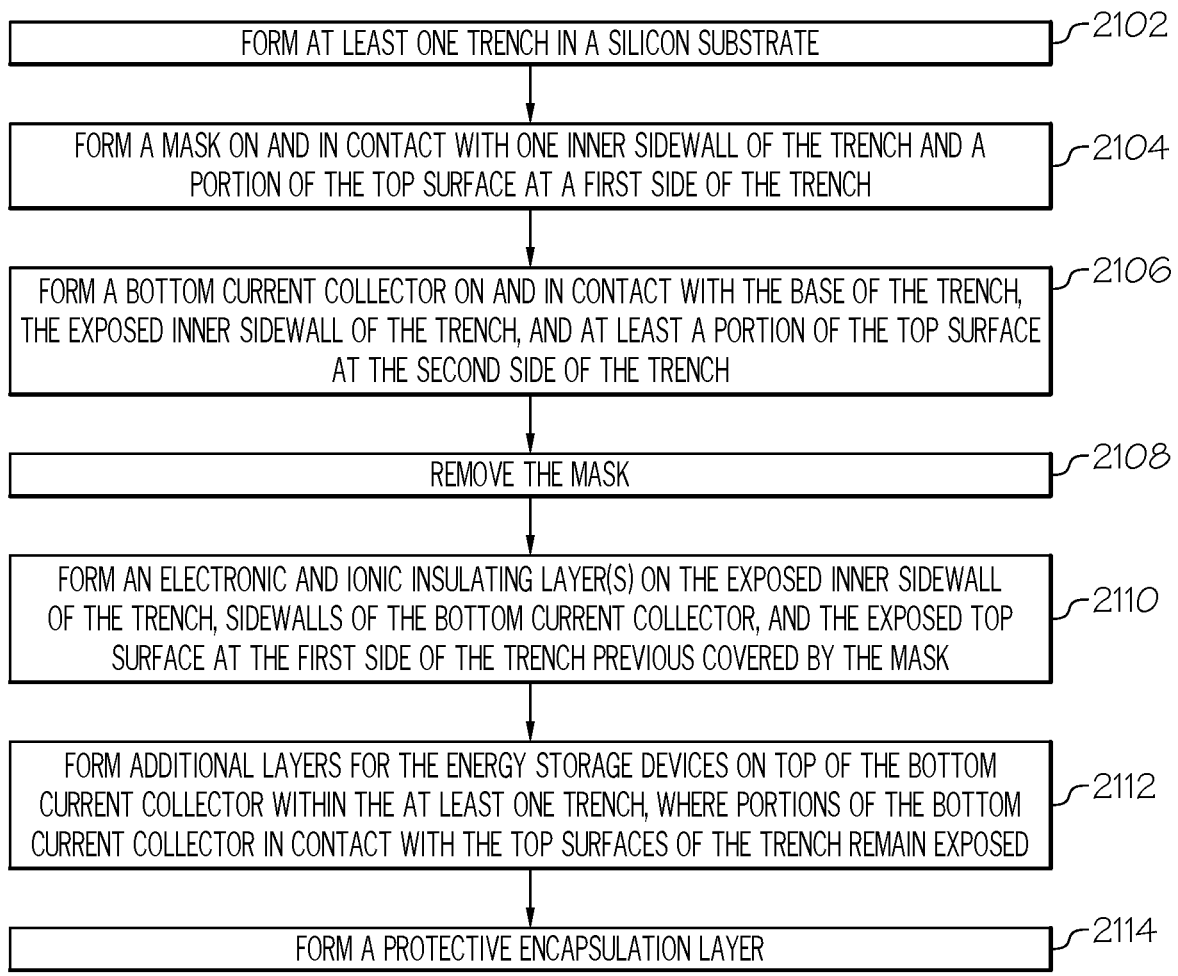
FIG. 21 is an operational flow diagram illustrating another example of a process for forming a semiconductor device structure comprising an energy storage device containment feature according one embodiment of the present disclosure

FIG. 21 is an operational flow diagram illustrating one example of a process for forming an energy storage device. It should be noted that each of the steps shown in FIG. 21 has been discussed in greater detail above with respect to FIGS. 13-16. At least one trench, at step 2102, is formed in a silicon substrate. The at least one trench provides an energy storage device containment feature. A mask, at step 2104, is formed on and in contact with one inner sidewall of the trench and a portion of the top surface at a first side of the trench. A bottom current collector, at step 2106, is formed on and in contact with the base of the trench, the exposed inner sidewall of the trench, and at least a portion of the top surface at the second side of the trench.

The mask, at step 2108, is removed. An electronic and ionic insulating layer(s) (or multilayers), at step 2110, is formed on the exposed inner sidewall of the trench, the sidewall adhered portion of the bottom current collector, and the exposed top surface at the first side of the trench previous covered by the mask. If the top surface of the second side of the trench is only partially covered by the bottom current collector the electronic and ionic insulating spacer may be formed on the remaining portion of the top surface. The electronic and ionic insulating spacer may also be formed on the outer sidewalls of the trench/substrate as well. Additional layers for the energy storage devices, at step 2112, are then be formed on top of the bottom current collector within the at least one trench, where portions of the bottom current collector in contact with the top surfaces of the trench remain exposed. One or more protective encapsulation layers, at step 2114, may then be formed.

One or more embodiments provide energy storage housing units through the creation of very shallow (<100 nm), shallow (100 nm) to deep (>1 mm) trenches, channels, or pores that are utilized for the containment/housing of active energy storage device components or layers.

In some embodiments, single or multiple through silicon vias (TSVs) are formed for the connection of one of the energy storage device current collectors (e.g., on the backside of the substrate) to the active energy storage device components (e.g., at the base of the trench, which is hermetically sealed through the filling of TSVs).

Methods for the development of both trenches, channels, pores and TSVs are provided in one embodiment embodiments, which facilitate the deposition of either thin or thick active energy storage device components or layers achieved through the relative thickness of the original substrate and the relative dimensions of the trenches, channels, pores, and TSVs.

One or more energy storage housing units, in some embodiments, comprise materials that present favorable housing conditions for the energy storage device, such as structural integrity and electrical, ionic, and environmental protection/encapsulation and additionally a low electrically resistive contact for the bottom of the energy storage device, if TSV structures are not employed. These housing materials may be composed of but not limited to: silicon, silicon composites, doped silicon material (e.g., Boron Doped crystalline silicon), graphene, gallium nitride, and any other suitable materials for the fabrication of energy storage housing units.

In some embodiments, methods are provided for the deposition and adherence of electrical, environmental, and/or ion (e.g., lithium) barrier materials into/onto the walls, TSVs, and complete surface area of the energy storage housing unit.

Hard masks, in one or more embodiments, may be applied onto/into the trenches of the energy storage housing units using a lock-and-key type mechanism. The relative dimensions of the hard mask may determine what area of the energy storage device housing unit is exposed for the deposition of energy storage device active materials. In some embodiments, soft masks (e.g., photoresists) may be applied onto/into the trenches of the energy storage housing units using a similar iterative process for applying an active energy storage device layer or layers, removing the mask, and applying another mask of specific area exposure enabling dimensions, and continuing the progressive active energy storage device fabrication process. The relative dimensions of the soft mask may determine what area of the energy storage device housing unit is exposed for the deposition of energy storage device active materials.

The deposition of active energy storage layer components is performed, in some embodiments, in a sequential controlled fashion. A single hard or soft mask with specific dimensions may be utilized for the deposition of a single active energy storage layer. The respective hard or soft mask may then be removed and another hard or soft mask with dimensionality different from the previous hard or soft mask may be applied. The deposition of the next active energy storage layer may then be administered. This process may be repeated until all active battery component layers (e.g., backside current collector, anode, electrolyte, interfacial additive layers, cathode, and topside current collector) are deposited. The layers may be deposited in no specific order other than the first and last active battery components are both current collector materials in some embodiments. Encapsulation and protective layers may be deposited to complete the TSV energy storage device.

In one or more embodiments, the current collectors may take the form of, but are not limited to: aluminum, titanium, copper, copper alloys, copper/nickel alloys, platinum, titanium/platinum alloys, titanium/platinum/titanium alloys, titanium/nitride alloys, tungsten, nickel, nickel/tungsten alloys, gold, silver, tantalum, and any other feasible current collector material or metal which performs the function of current collectors in a stable or non-stable fashion when utilized in energy storage devices.

The backside current collector, in some embodiments, may be utilized as both a hard mechanical surface, conductive material, and heat-transfer source for the heating, annealing, synthesis, densification and interlayer-adhesion, cold or hot pressing of active battery components or layers together in order to achieve improved device performance.

In some embodiments, the internal-side of the backside current collector may be used as a bottom contact during cold or hot pressing of solid or semi-solid electrolytes, electrode/electrolyte composites, or any other component or layer of the active energy storage layers which requires cold or hot pressing in achieving desired performance properties (e.g., altering the crystal state of cathode ($LiCoO_2$) materials, reaching the glass-transition and densification temperature/conditions of solid electrolytes, etc.).

Cathode materials, in some embodiments, may take the form of, but are not limited to any use or combination of mixture of the following materials: $LiCoO_2$ (LCO), $LiMn_2O_4$ (LMO), lithium manganese oxyflouride ($Li_2MnO_2F$), $LiNiMnCoO_2$ (NMC), $LiMn_{1.5}Ni0.5O4$, lithium iron phosphate ($LiFePO_4$), lithium nickel cobalt aluminum oxide ($LiNiCoAlO_2$) (NCA) and respective fluorinated derivatives, $LiFeMnPO_4$, and any other feasible cathode material or metal which performs the function of active cathode materials in a stable or non-stable fashion when utilized in energy storage devices.

Electrolyte materials, in some embodiments, may take the form of, but are not limited to any use or combination of mixture of the following materials: LiPON, LiPO, $Li_2S$, $Li_3PS_4$, $Li_{10}GeP_2S_{12}$, $Si_4SnS_4$, $Li_6PS_4Cl$, $Li_2O$, $LiAlO_2$, $Li_4Ti_5O_{12}$, $Li_2ZrO_3$, $Li_7LaZr_2O_{12}$, $Li_4GeO_4$, $LiNbO_3$, $LiGe_2(PO_4)_3$, $LiTi_2(PO_4)_3$, $Li_2MgBr_4$, LiBOCl, $Li_2MgCl_4$, $LiAlCl_4$, $Li_3CdCl$, $LiAlTi(PO_4)_3$ (LATP), $LiAlGe(PO_4)_3$ (LAGP), $Li_7La_3Ar_2O_{12}$ (LLZ), thio-LISCON electrolytes, $Li3.25$ $Ge0.25P0.75$ $S_4$, $Li_{10}GeP_2S_{12}$, $Li_2S—P_2S_4$, $Li_7P_3S_{11}$, $Li_{10}Ge_3P_2S_{12}$, $Li6.75La3Ar1.75Nb0.25O12$, Gel Polymers, Ceramics, Sol-Gel combination, $Li_3S—SiS_2-Li_3PO_4$, Li1.3A10.3, Ti1.7 (PO4)3, or any $LiAlTi(PO_4)$, or any combination of varying $Li_2S$ to $P_2S_4$ percent combinations, and any other feasible electrolyte which performs the function of electrolyte active layers in a stable or non-stable fashion when utilized in energy storage devices.

Anode materials, in some embodiments, may take the form of, but are not limited to any use or combination of mixture of the following materials: lithium metal, lithium-sulfur materials, silicon, porous silicon, surface or compositionally treated porous silicon material, silicon-based core-shell lithium containing materials, nanoparticle-based (e.g., gold) lithium nucleation and containment materials, lithium copper materials, lithium nickel Oxide materials, lithium aluminum oxide materials, lithium-carbon materials, lithium graphite composites, lithium metal/graphite combinations, lithium carbon nanotubes, lithium/reduced graphene oxide combinations and any other feasible anode material or metal which performs the function of anode active layers in a stable or non-stable fashion when utilized in energy storage devices.

Active energy storage device layers or components for additive materials, in some embodiments, may take the form of, but are not limited to any use or combination of mixture of the following materials to be implemented or applied between active battery component layers (at the interface) or integrated with active battery component layer: $LiO_2-ZrO_2$, $liNbO_3$, LiF deposited electrochemically or via evaporation, $Li_3PO_4$, $Li_4SiO_4$, $Li_3N$, Lithium/alumina, LISICON, LIPON, NASICON, Aluminum Oxide ($Al_2O_3$), $TiO_2$Lithium/reduced graphene oxide combinations, Lithium salt containing polymer composites such as Li-salt containing polyaniline, molten lithium metal, molten lithium salt, molten lithium salt composites, plasticizer material(s) such as succinonitrile, or any other interfacial or active layer additive that can increase the desired performance (e.g., better interlayer adhesion, lower interfacial resistance, higher Li and/or electrical conductivity, etc.) of the energy storage device.

In some embodiments, the cathode, electrolyte anode, additive materials, and any suitable lithium adhering, intercalating, transporting, or storing active component material may also be mixed to form homogeneous mixture active component materials that may enhance performance properties such as: lifecycle, structural stability, volume expansion, interfacial adhesion, energy density, power density, electronic conductivity or ionic conductivity through their combination with additive materials such as carbon, graphite, graphite oxide, reduced graphite oxide, graphene, reduced, functionalized graphite oxide, functionalized graphene, functionalized, surface-passivated (e.g., surfactant-linked) carbon/graphite/graphene composites, carbon nanotubes, functionalized carbon nanotubes, layer-by-layer carbon composites, carbon/polymer composites, carbon nanoplatlets, graphene quantum dots, quantum dots, metal-oxide nanoparticles, and any other materials that may enhanced the previously indicated active component material properties.

The above materials, in one or more embodiments, may be synthesized in-situ or ex-situ during or before deposition, respectively. The materials may be deposited in a wet chemistry fashion (e.g., slurry, pastes, lamination, electroplating, etc.) or a dry chemistry fashion (e.g., physical vapor deposition, atomic layer deposition, chemical vapor deposition, aerosol deposition, etc.).

In some embodiments, a top current collector may be formed through dry or wet deposition methods that enable a hermetically sealed top current collector, thereby rendering a hermetically sealed TSV energy storage device. The post-deposited and current collector planarized TSV energy storage device, in some embodiments, may be encapsulated and protected from electrical, environmental, and ionic interference.

The present disclosure may include a design for an integrated circuit chip, which may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming a semiconductor device structure, the method comprising at least:
    forming at least one trench in a silicon substrate, the at least one trench providing an energy storage device containment feature; and
    forming a plurality of vias through a base of the at least one trench.

2. The method of claim 1, wherein forming the plurality of vias comprises etching the base of the at least one trench into a plurality of portions.

3. The method of claim 1, further comprising:
    prior to forming the plurality of vias, forming at least one electrical and ionic insulating layer over the silicon substrate and within the at least one trench; and
    removing portions of the least one electrical and ionic insulating layer from the base of the at least one trench.

4. The method of claim 1, further comprising:
    filling the vias with a metal material, and
    planarizing a first portion of the metal material extending above the base of the at least one trench and a second portion of the metal material extending below a bottom surface of the silicon substrate, wherein the planarized first portion of the metal material forms a trench base current collector and the planarized second portion of the metal material forms a backside current collector.

5. The method of claim 4, further comprising:
    prior to filling the vias with the metal material, forming a seed layer in contact with inter-via islands defined by the plurality of vias in the silicon substrate; and
    filling the vias with the metal material utilizing the seed layer.

6. The method of claim 5, wherein prior to forming the seed layer the method further comprises:
    forming an adhesion layer at least in contact with the inter-via islands.

7. The method of claim 4, further comprising:
    forming a first active electrode in contact with the trench base current collector for an energy storage device disposed in the energy storage device containment feature;
    forming an electrolyte layer over the first active electrode;
    forming a second active electrode layer for the energy storage device over the electrolyte layer; and
    forming a topside current collector over the second active electrode layer.

8. The method of claim 7, further comprising:
    forming an encapsulation layer over at least portions of an electrical and ionic insulating layer formed on a top surface of the silicon substrate, and a portion of the backside current collector and a portion of the topside current collector.

9. The method of claim 7, further comprising:
    forming a first interfacial layer disposed between the first active electrode and the electrolyte layer; and
    forming a second interfacial layer disposed between the electrolyte layer and the second active electrode layer.

10. The method of claim 7, wherein forming each of the trench base current collector, first active electrode, electrolyte layer, and second active electrode comprises:
    forming a respective mask over a top surface of the silicon substrate and a portion of sidewalls of the at least one trench, the respective mask defining a height of the trench base current collector, first active electrode, electrolyte layer, and second active electrode;

forming each of the first current collector, first active electrode, electrolyte layer, and second active electrode after the respective mask has been formed; and removing the respective mask prior to forming a subsequent layer.

11. A method for forming a semiconductor device structure, the method comprising at least:

forming a plurality of vias through a backside of a silicon substrate;

filling the vias with a metal material;

forming at least one trench through a topside of the silicon substrate providing an energy storage device containment feature, wherein the at least one trench exposes the metal material filled vias; and forming at least one electrical and ionic insulating layer over the silicon substrate and one or more portions of the at least one trench.

12. The method of claim 11, further comprising:

prior to filling the vias with the metal material, forming a seed layer on inter-via islands defined by the plurality of vias in the silicon substrate; and filling the vias with the metal material utilizing the seed layer.

13. The method of claim 12, wherein prior to forming the seed layer the method further comprises:

forming an adhesion layer at least in contact with the inter-via islands.

14. The method of claim 11, further comprising:

removing portions of the least one electrical and ionic insulating layer from a base of the at least one trench.

15. The method of claim 11, further comprising:

forming a trench base current collector at the base of the at least one trench; and forming a backside current collector at the backside of the silicon substrate, wherein the trench base current collector and the backside current collector are electrically coupled by the metal material within the plurality of vias.

16. The method of claim 15, further comprising:

forming a first active electrode in contact with the trench base current collector for an energy storage device disposed in the energy storage device containment feature;

forming an electrolyte layer over the first active electrode;

forming a second active electrode layer for the energy storage device over the electrolyte layer;

forming a topside current collector over the second active electrode layer; and forming an encapsulation layer over at least portions of an electrical and ionic insulating layer formed on a top surface of the silicon substrate, and a portion of the backside current collector and a portion of the topside current collector.

17. The method of claim 16, further comprising:

forming a first interfacial layer disposed between the first active electrode and the electrolyte layer; and forming a second interfacial layer disposed between the electrolyte layer and the second active electrode layer.

18. The method of claim 16, wherein forming each of the trench base current collector, first active electrode, electrolyte layer, and second active electrode comprises:

forming a respective mask over a top surface of the silicon substrate and a portion of sidewalls of the at least one trench, the respective mask defining a height of the trench base current collector, first active electrode, electrolyte layer, and second active electrode;

forming each of the first current collector, first active electrode, electrolyte layer, and second active electrode after the respective mask has been formed; and removing the respective mask prior to forming a subsequent layer.

19. A semiconductor device structure comprising at least:

a silicon substrate having at least one trench disposed therein, the at least one trench providing an energy storage device containment feature;

a plurality of vias formed within a base of the trench, wherein each via of the plurality of vias comprises metal material;

a trench base current collector disposed within the at least one trench and on the plurality of vias in contact with the metal material;

a backside current collector disposed on a backside of the silicon substrate opposite the at least one trench and in contact with the metal material; and at least one cathode layer and at least one anode layer disposed within the at least one trench.

* * * * *